US011621141B2

(12) United States Patent
Iwaya et al.

(10) Patent No.: US 11,621,141 B2
(45) Date of Patent: Apr. 4, 2023

(54) ION MILLING DEVICE AND ION MILLING METHOD

(71) Applicant: Hitachi High-Technologies Corporation, Tokyo (JP)

(72) Inventors: Toru Iwaya, Tokyo (JP); Hisayuki Takasu, Tokyo (JP); Sakae Koubori, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 990 days.

(21) Appl. No.: 16/077,782

(22) PCT Filed: Feb. 26, 2016

(86) PCT No.: PCT/JP2016/055868
§ 371 (c)(1),
(2) Date: Aug. 14, 2018

(87) PCT Pub. No.: WO2017/145371
PCT Pub. Date: Aug. 31, 2017

(65) Prior Publication Data
US 2021/0193430 A1 Jun. 24, 2021

(51) Int. Cl.
H01J 37/20 (2006.01)
H01J 37/305 (2006.01)
(Continued)

(52) U.S. Cl.
CPC .............. *H01J 37/20* (2013.01); *H01J 37/08* (2013.01); *H01J 37/265* (2013.01); *H01J 37/30* (2013.01);
(Continued)

(58) Field of Classification Search
CPC .. H01J 37/20; H01J 37/3053; H01J 2237/202; H01J 2237/2021; H01J 2237/20214; H01J 2237/20228
See application file for complete search history.

(56) References Cited

U.S. PATENT DOCUMENTS 5,783,830 A 7/1998 Hirose et al.
6,992,309 B1 * 1/2006 Petry ................. H01J 37/304
250/397

(Continued)

FOREIGN PATENT DOCUMENTS

JP 7-35662 A 2/1995
JP 10-64473 A 3/1998

(Continued)

OTHER PUBLICATIONS

Japanese-language Office Action issued in Japanese Application No. 2020-135528 dated Jul. 20, 2021 with English translation (six (6) pages).

(Continued)

*Primary Examiner* — Eliza W Osenbaugh-Stewart
(74) *Attorney, Agent, or Firm* — Crowell & Moring LLP

(57) ABSTRACT

Provided is a machining technology to obtain a desired machining content while suppressing a possibility of causing a redeposition in a machining surface. The invention is directed to provide an ion milling device which includes an ion source which emits an ion beam, a sample holder which holds a sample, and a sample sliding mechanism which slides the sample holder in a direction including a normal direction of an axis of the ion beam.

6 Claims, 27 Drawing Sheets

(51) Int. Cl.
*H01J 37/08* (2006.01)
*H01J 37/26* (2006.01)
*H01J 37/304* (2006.01)
*H01J 37/30* (2006.01)

(52) U.S. Cl.
CPC ........ *H01J 37/304* (2013.01); *H01J 37/3053* (2013.01); *H01J 2237/026* (2013.01); *H01J 2237/202* (2013.01); *H01J 2237/20214* (2013.01); *H01J 2237/20221* (2013.01)

(56) References Cited

U.S. PATENT DOCUMENTS

| | | |
|---|---|---|
| 2004/0113097 A1 | 6/2004 | Marchman et al. |
| 2008/0202920 A1 | 8/2008 | Iwaya et al. |
| 2009/0218488 A1 | 9/2009 | Wells |
| 2011/0049382 A1 | 3/2011 | Miller et al. |
| 2013/0220806 A1 | 8/2013 | Iwaya et al. |
| 2014/0076717 A1 | 3/2014 | Nanri et al. |
| 2015/0369710 A1 | 12/2015 | Fuller et al. |

FOREIGN PATENT DOCUMENTS

| | | |
|---|---|---|
| JP | 2002-228562 A | 8/2002 |
| JP | 2003-68243 A | 3/2003 |
| JP | 2005-251745 A | 9/2005 |
| JP | 2007-14996 A | 1/2007 |
| JP | 2008-39667 A | 2/2008 |
| JP | 2008-204905 A | 9/2008 |
| JP | 2009-204611 A | 9/2009 |
| JP | 2009-276300 A | 11/2009 |
| JP | 2011-242334 A | 12/2011 |
| JP | 2012-94265 A | 5/2012 |
| JP | 2012-252941 A | 12/2012 |
| JP | 2013-503452 A | 1/2013 |
| JP | 2014-139938 A | 7/2014 |
| JP | 2014-149272 A | 8/2014 |
| JP | 2016-8971 A | 1/2016 |
| KR | 10-2013-0077884 A | 7/2013 |
| WO | WO 2012/060416 A1 | 5/2012 |

OTHER PUBLICATIONS

International Search Report (PCT/ISA/210) issued in PCT Application No. PCT/JP2016/055868 dated May 10, 2016 with English translation (six (6) pages).

Japanese-language Written Opinion (PCT/ISA/237) issued in PCT Application No. PCT/JP2016/055868 dated May 10, 2016 (five (5) pages).

Japanese-language Office Action issued in Japanese Application No. 2019-232171 dated Oct. 27, 2020 with English translation (10 pages).

Korean-language Office Action issued in counterpart Korean Application No. 10-2018-7018628 dated Jun. 27, 2019 with English translation (nine (9) pages).

Korean-language Office Action issued in counterpart Korean Application No. 10-2018-7018628 dated Dec. 27, 2019 with English translation (11 pages).

\* cited by examiner

[FIG. 1]
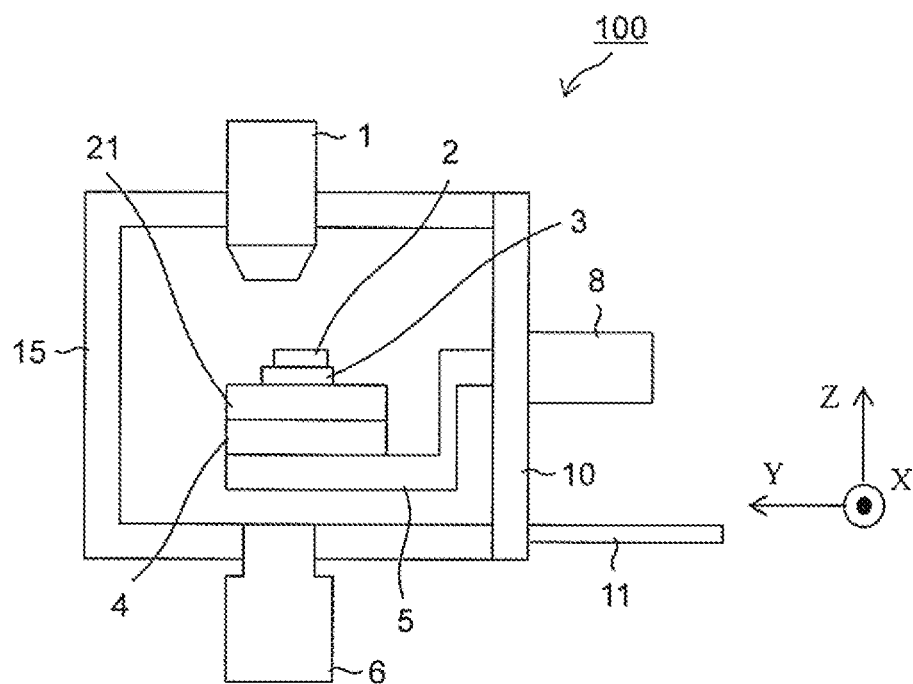
[FIG. 2A]
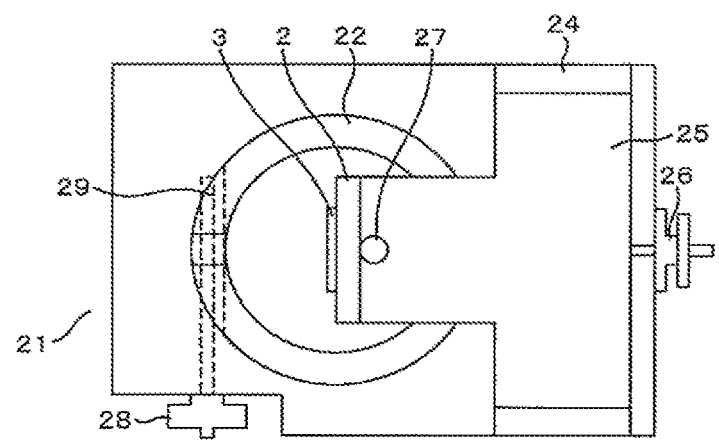
[FIG. 2B]
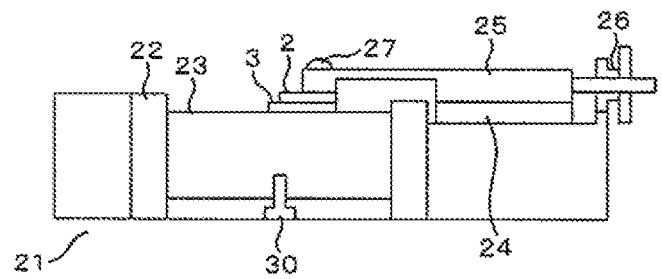

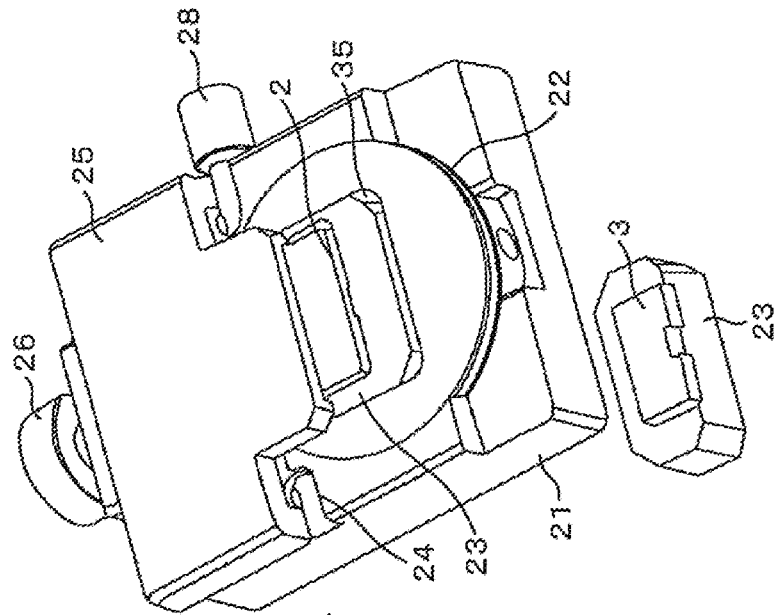
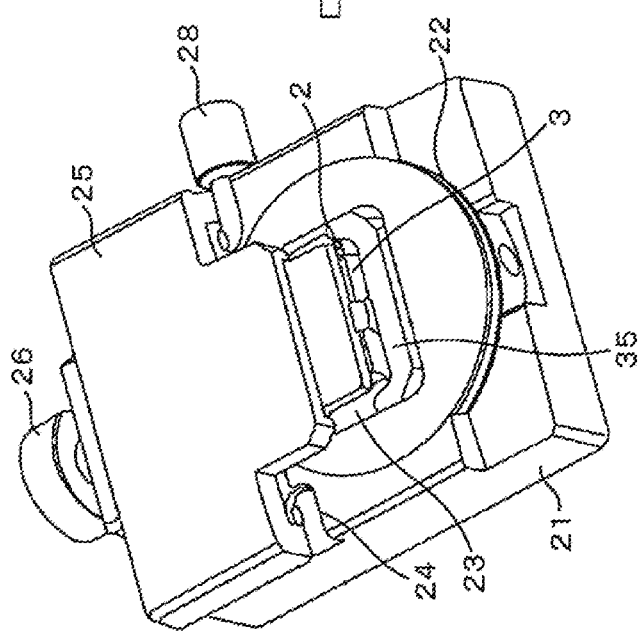

[FIG. 4]
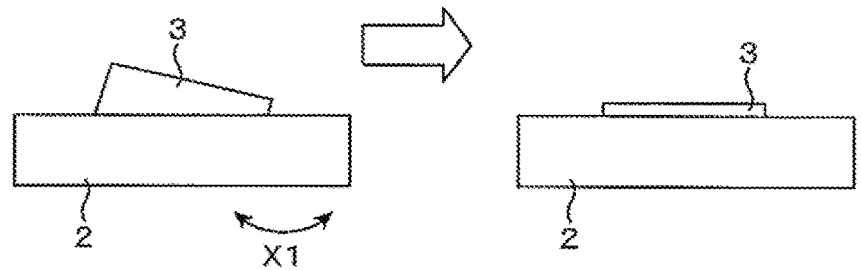
[FIG. 5]
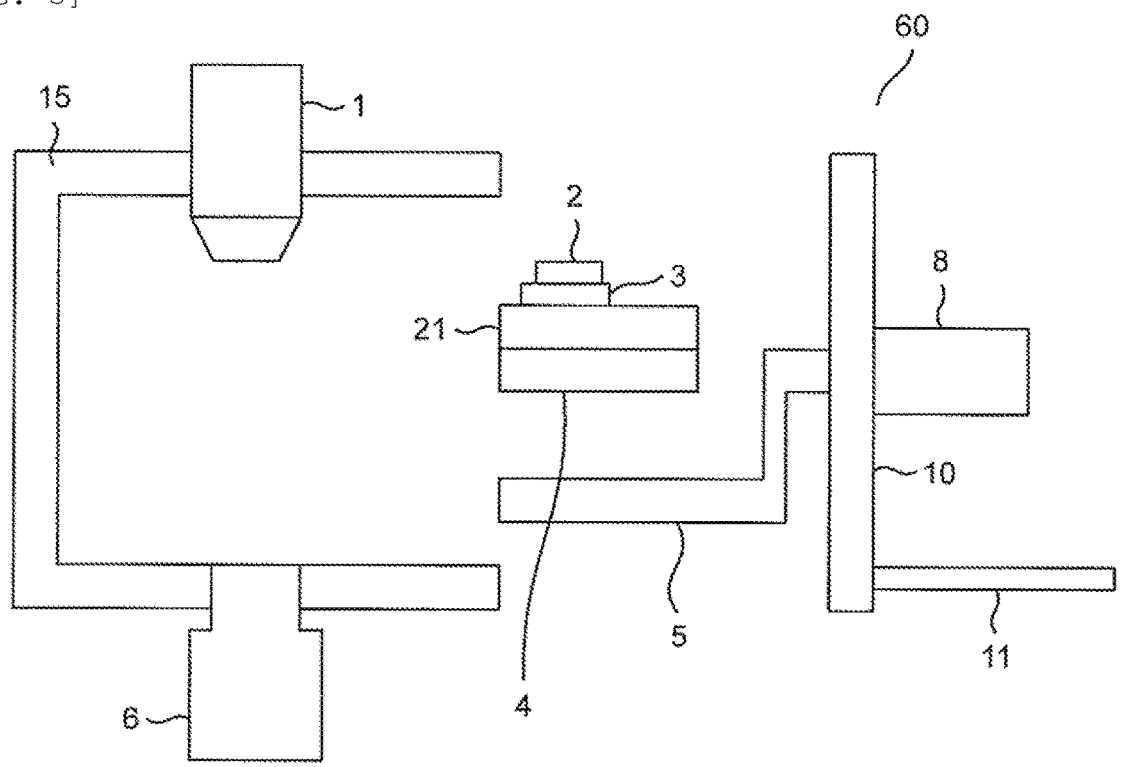

[FIG. 6]
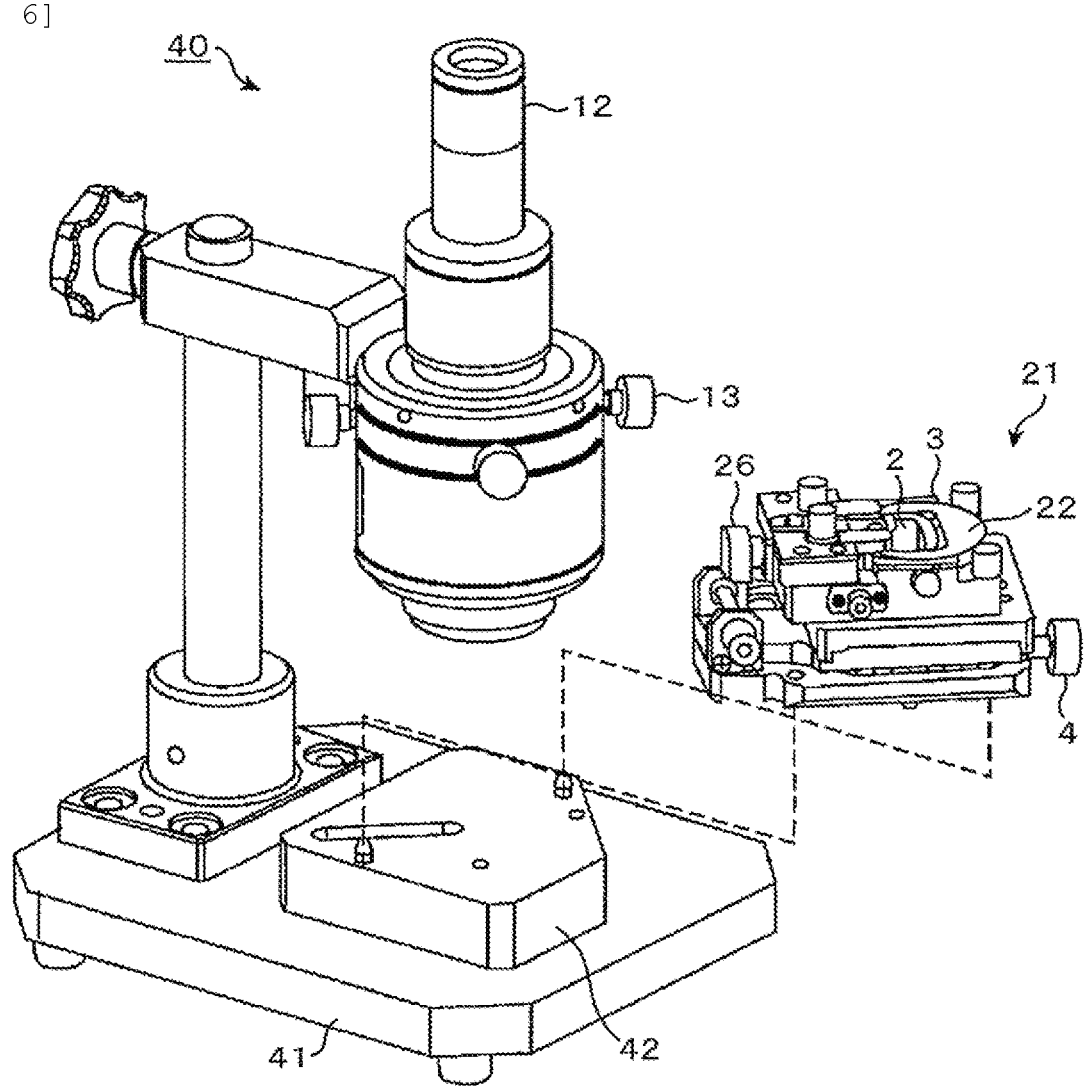

[FIG. 7]
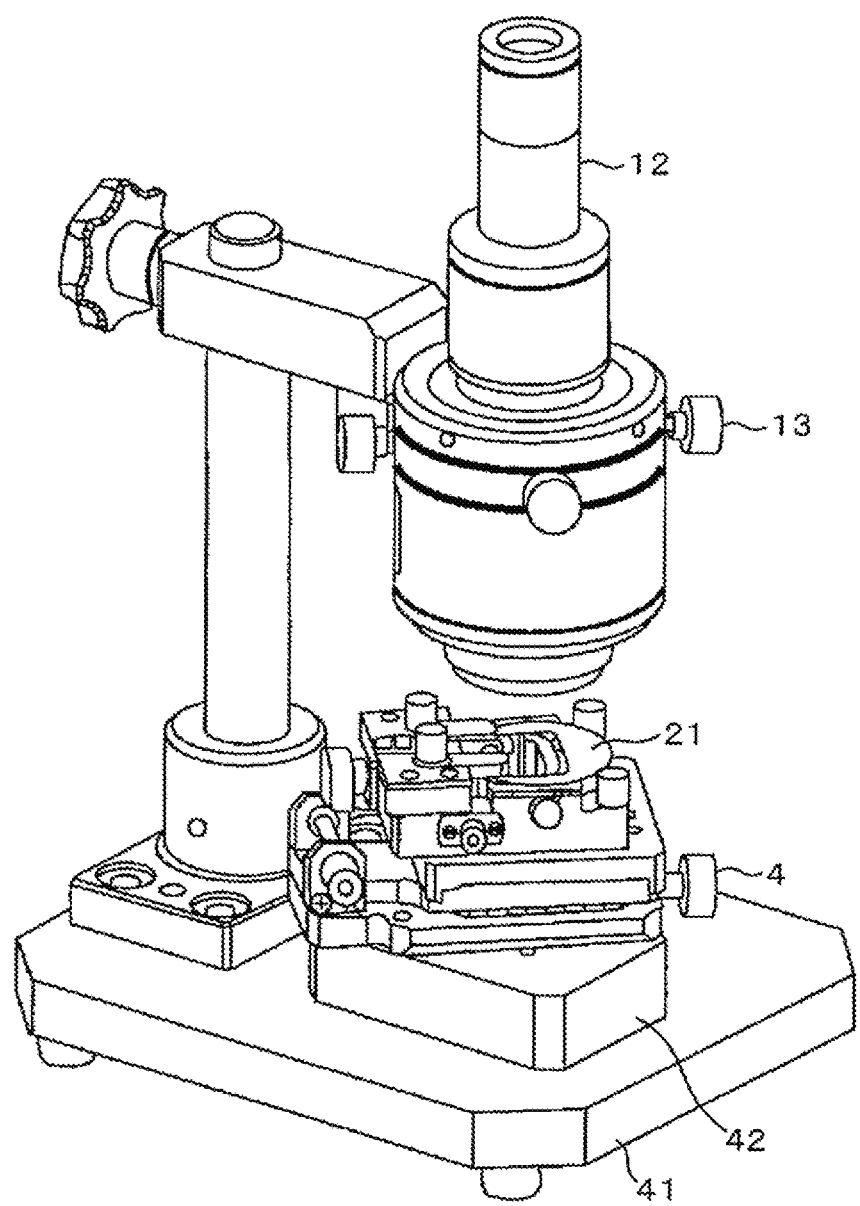

[FIG. 8]
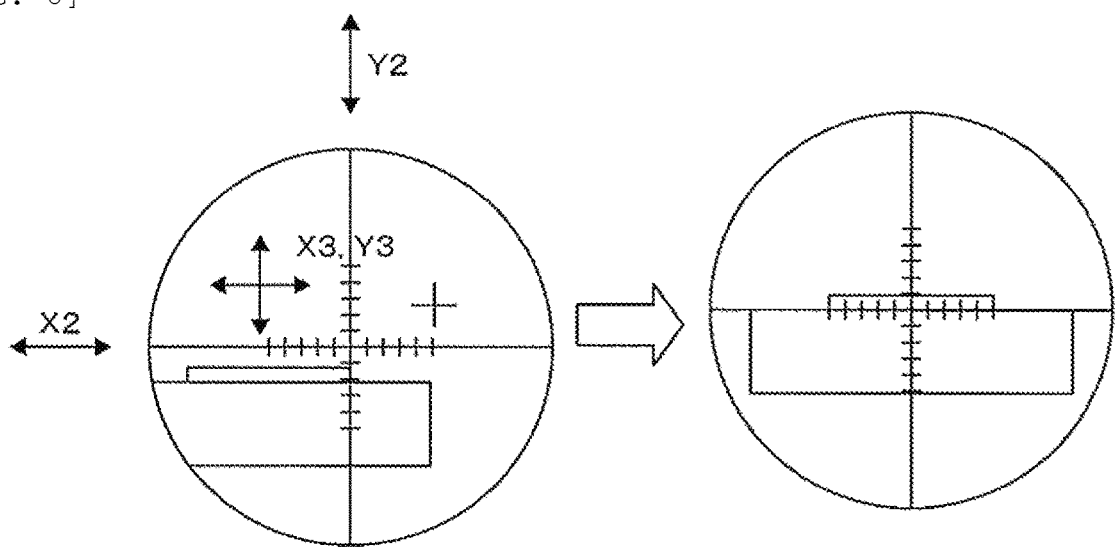
[FIG. 9]
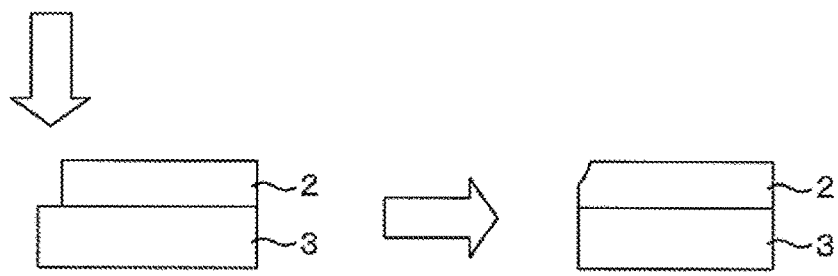

[FIG. 10]
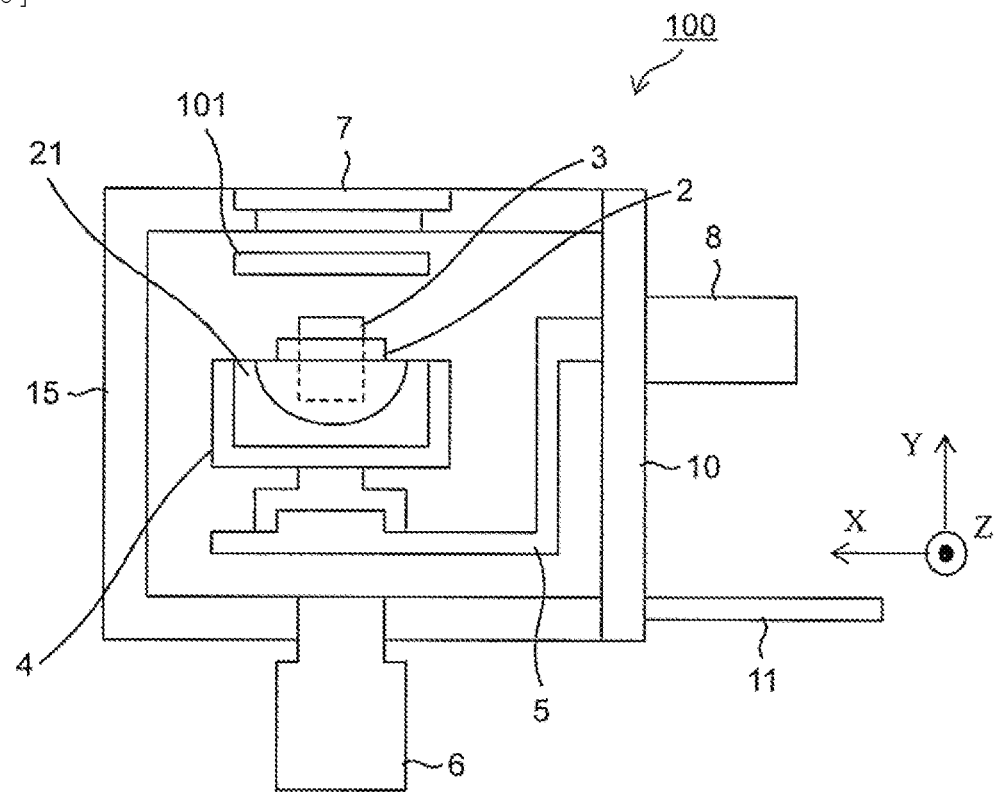
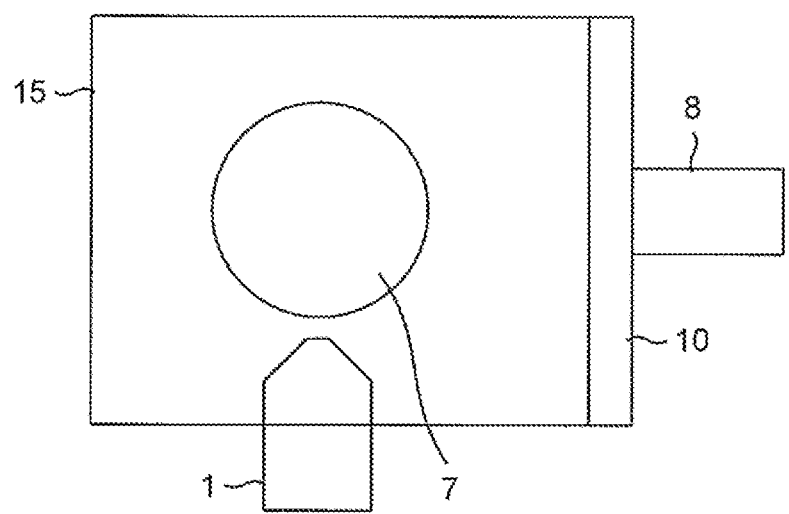

[FIG. 11A]
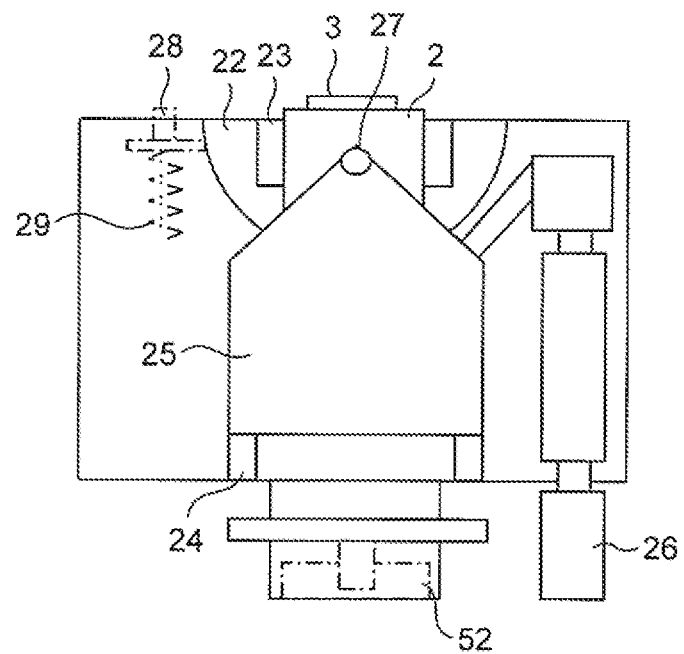
[FIG. 11B]
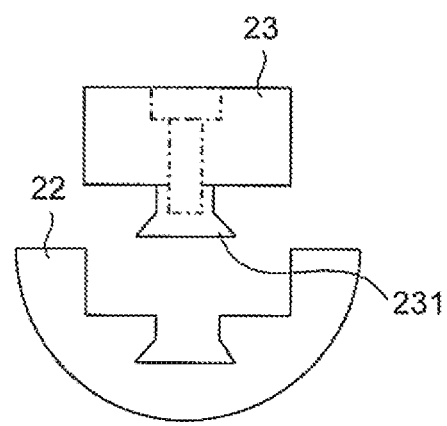

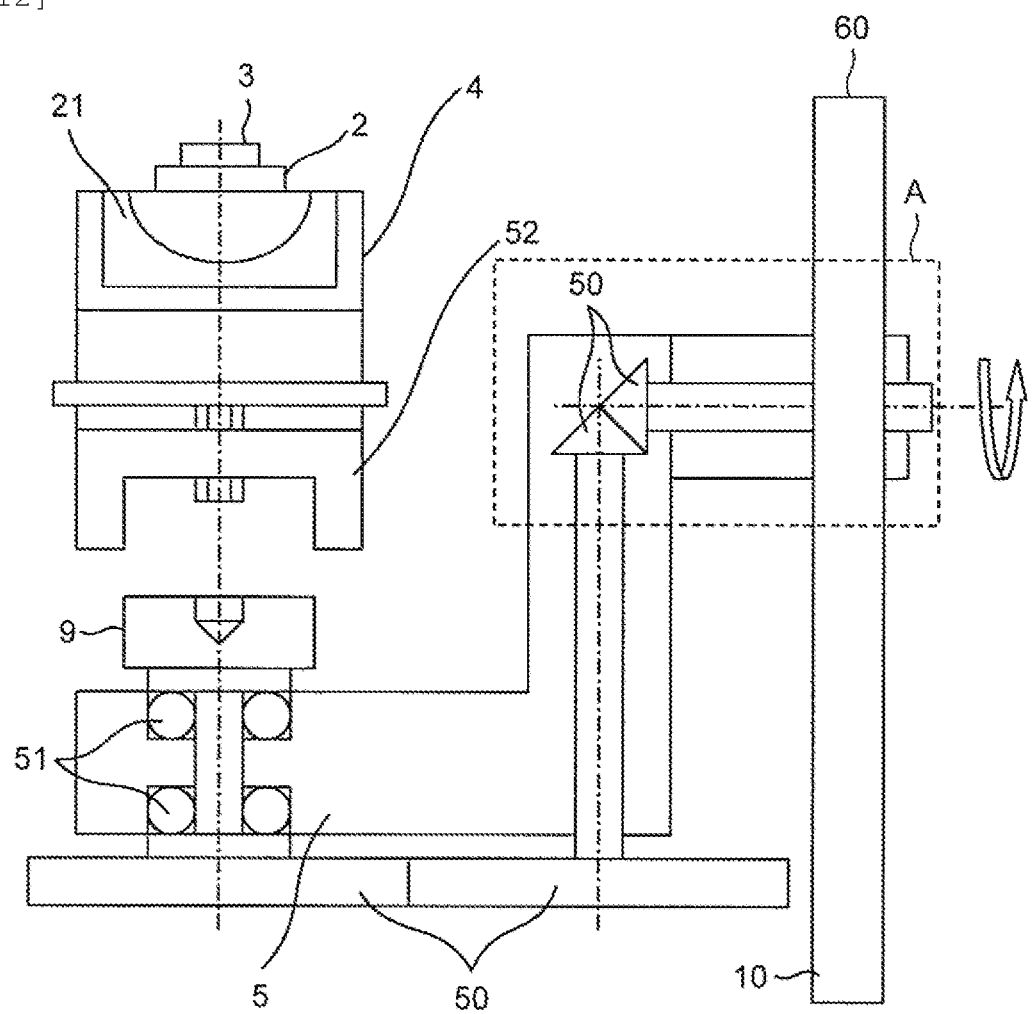
[FIG. 12]

[FIG. 13]
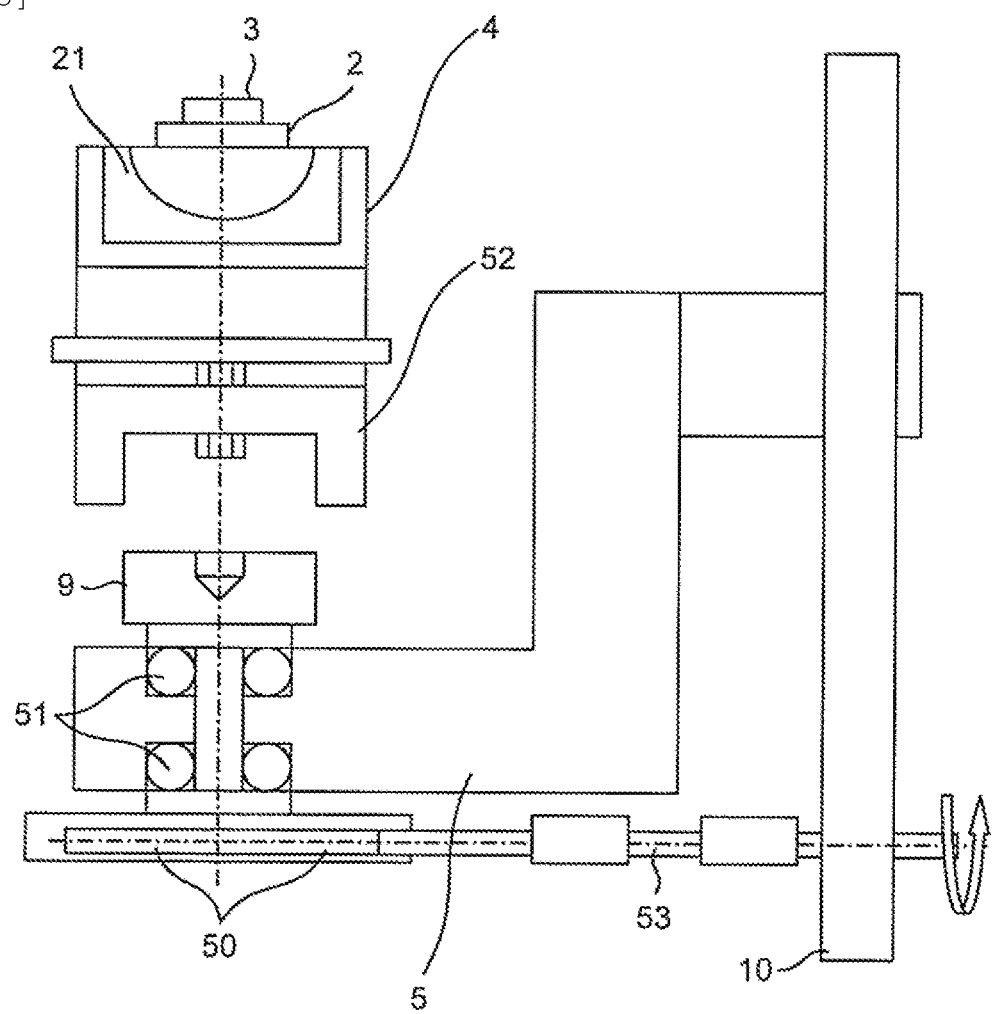

[FIG. 14]
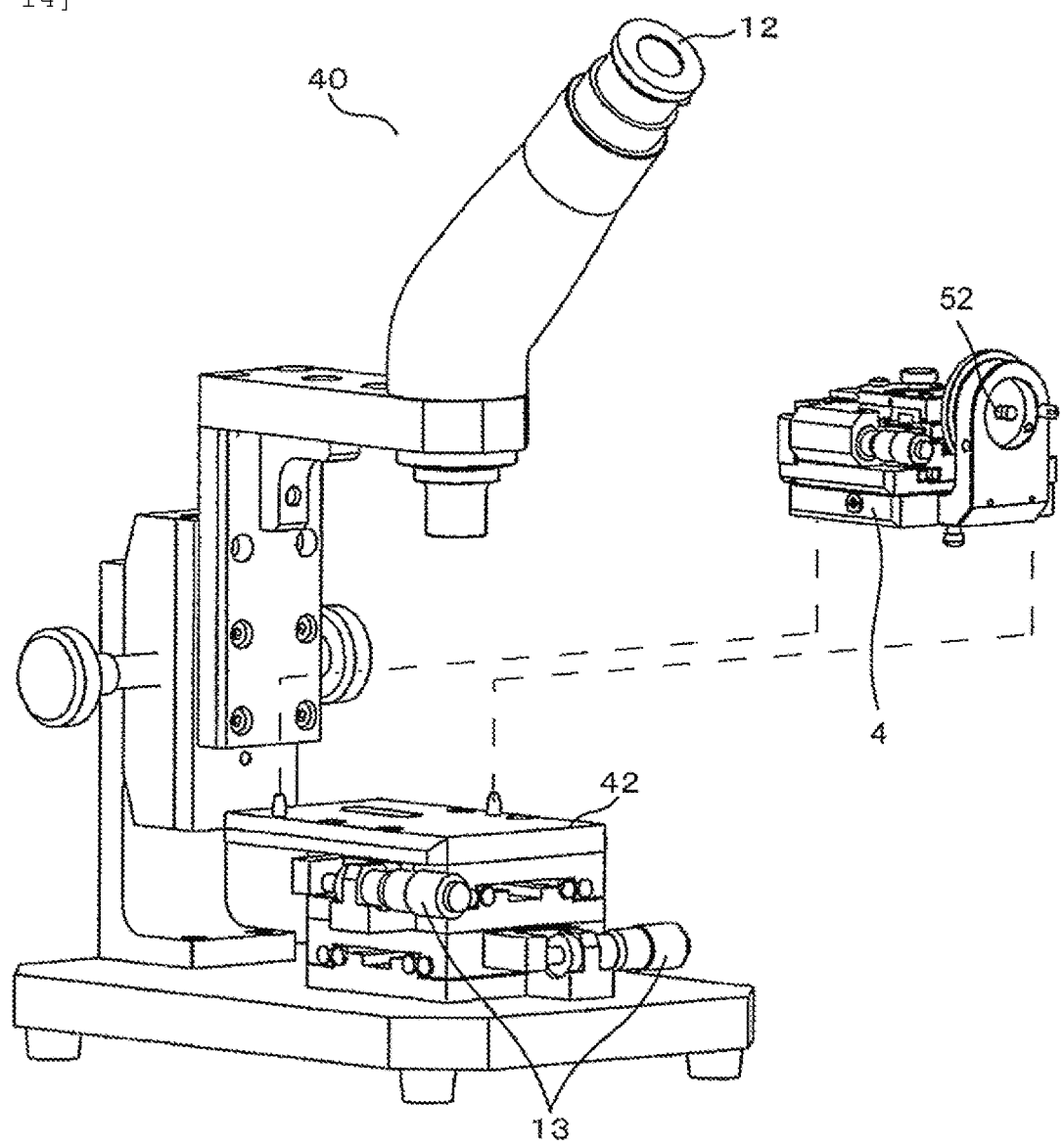

[FIG. 15]
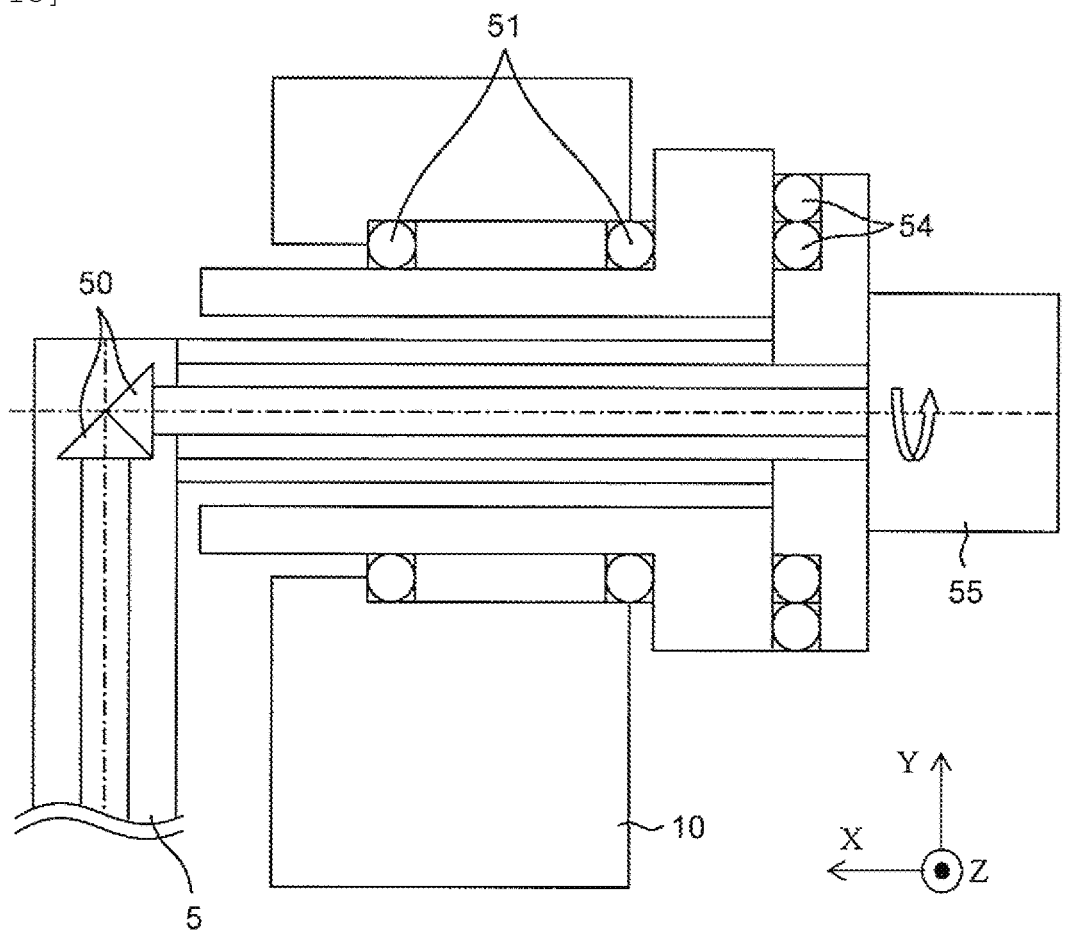

[FIG. 16]
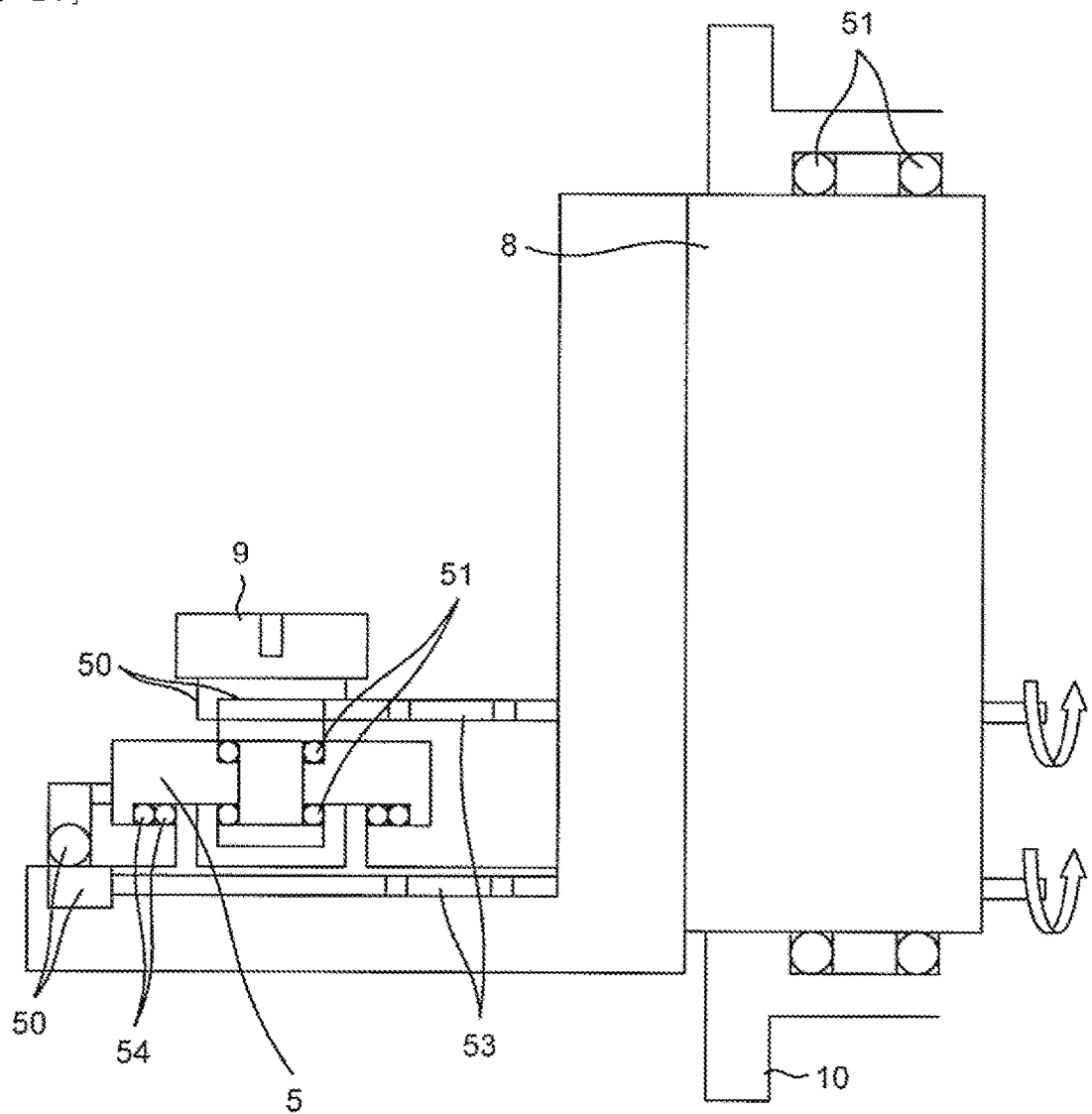
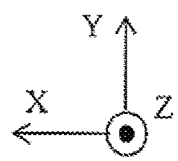

[FIG. 17]
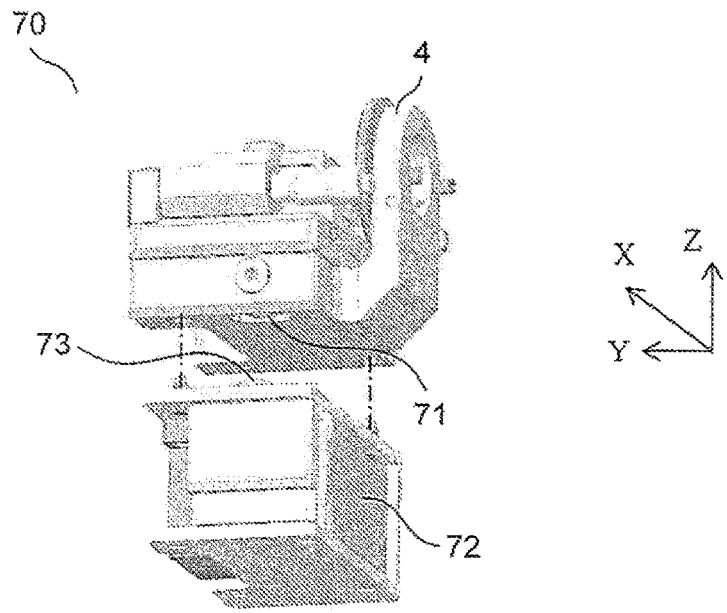
[FIG. 18]
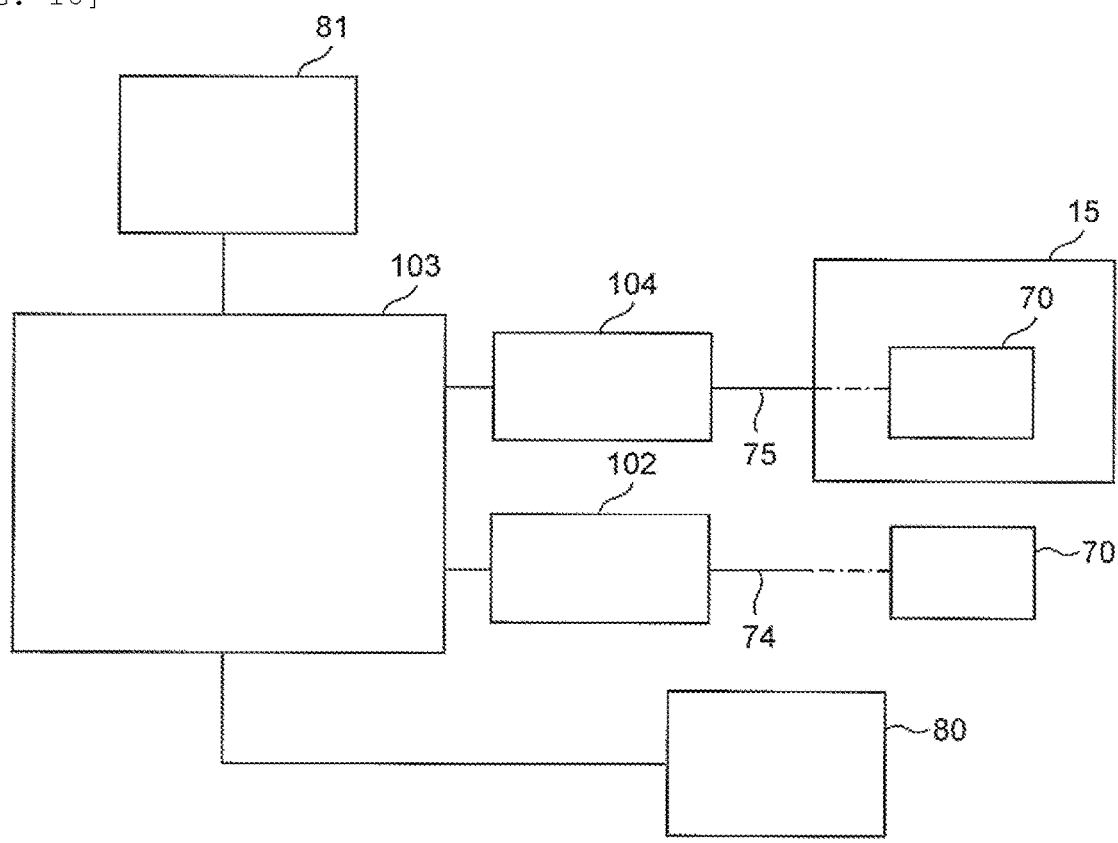

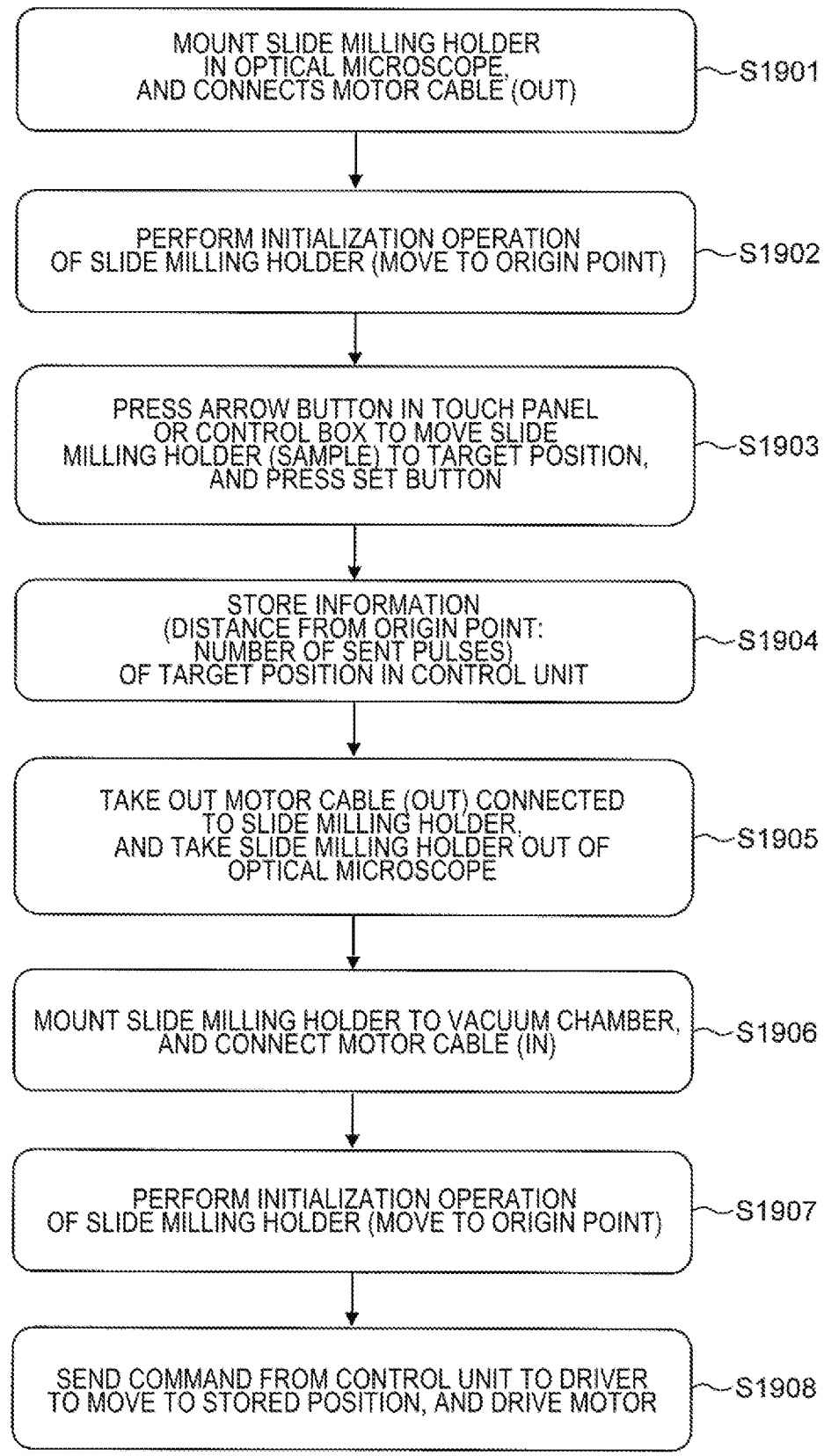

[FIG. 20]
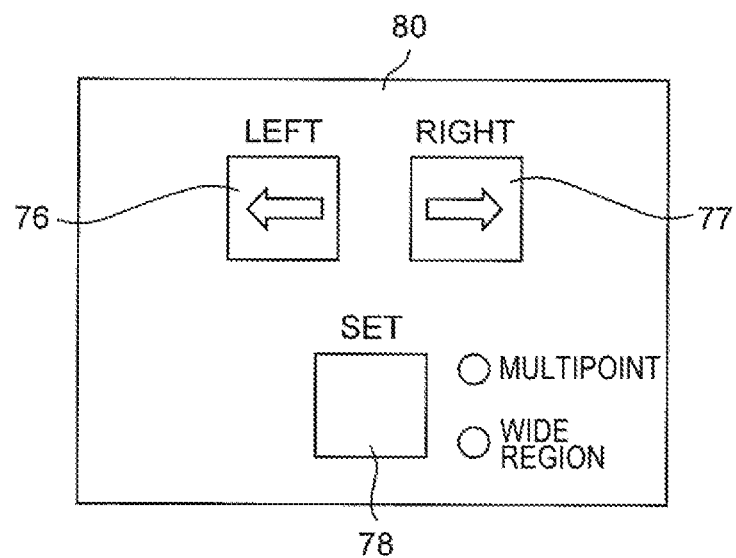
[FIG. 21]
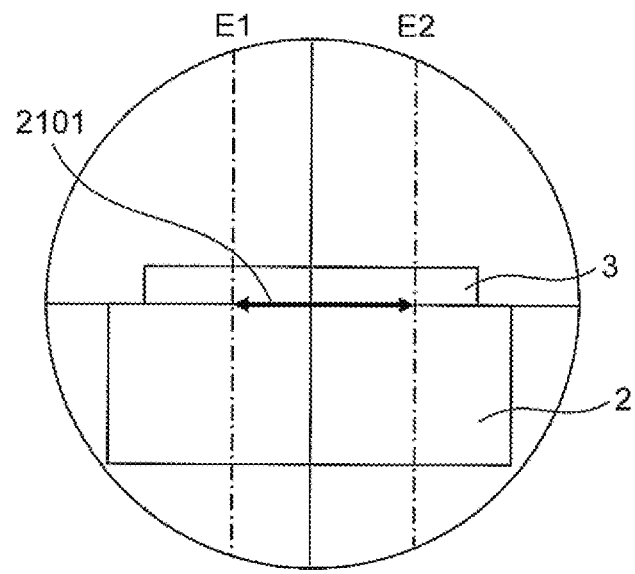

[FIG. 22]
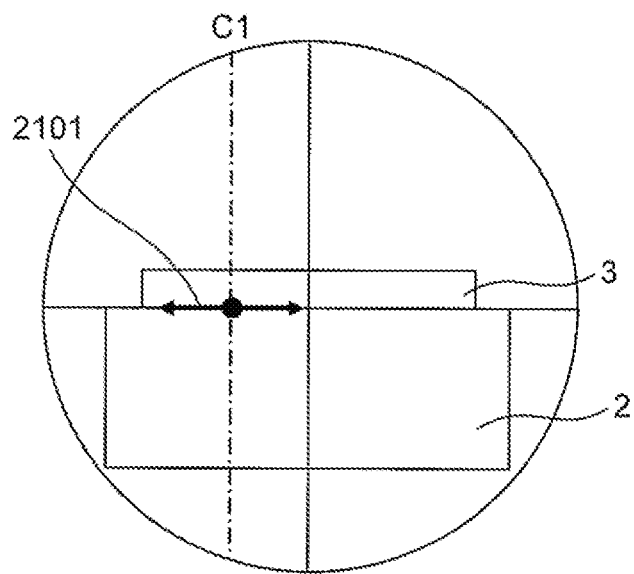
[FIG. 23]
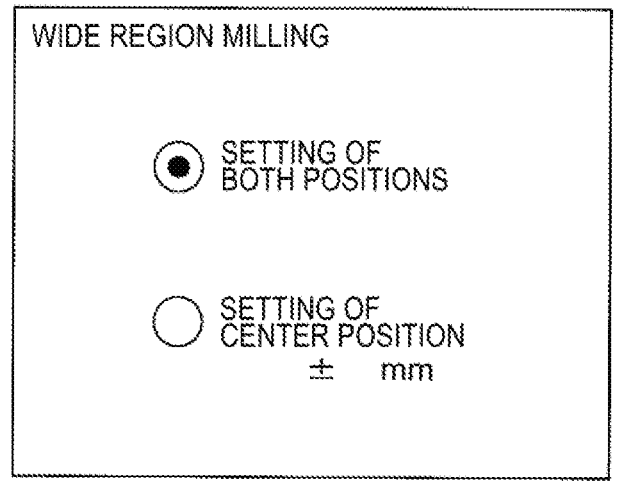

[FIG. 24A]
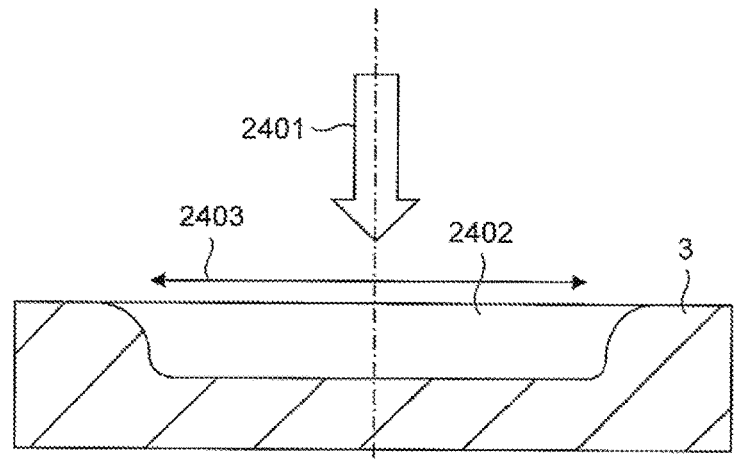
[FIG. 24B]
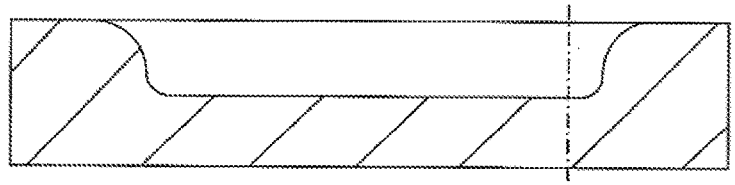
[FIG. 24C]
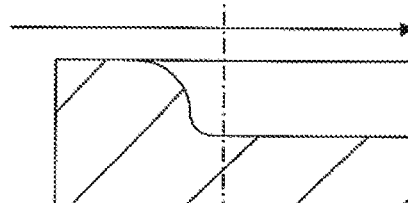
[FIG. 24D]
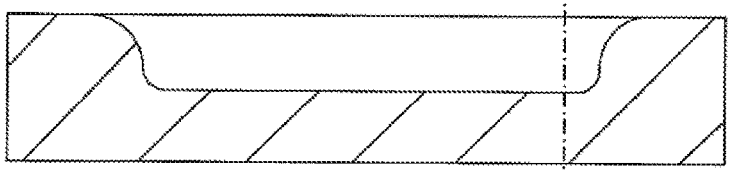

[FIG. 25]
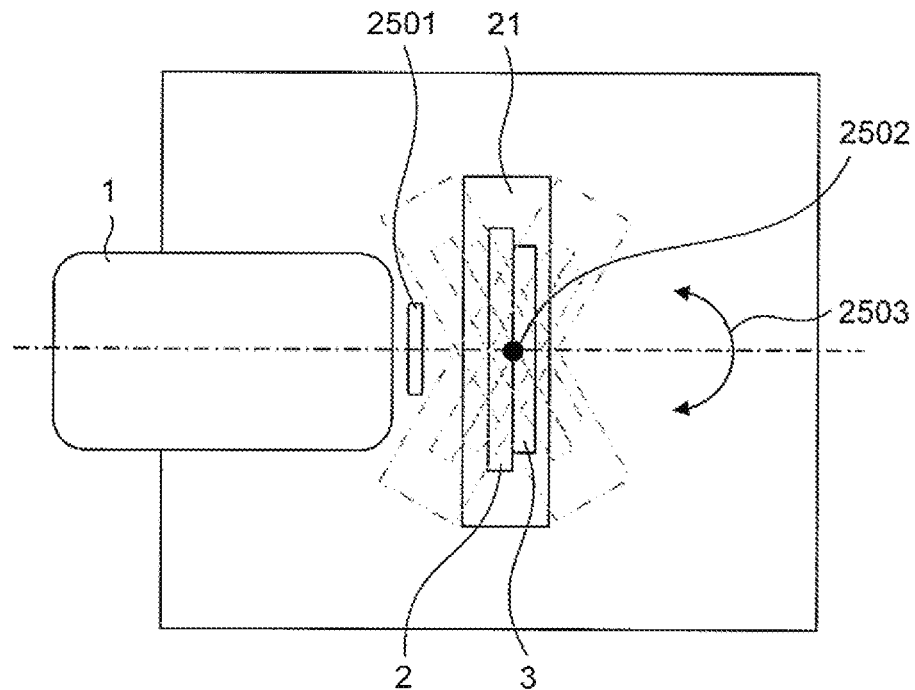
[FIG. 26]
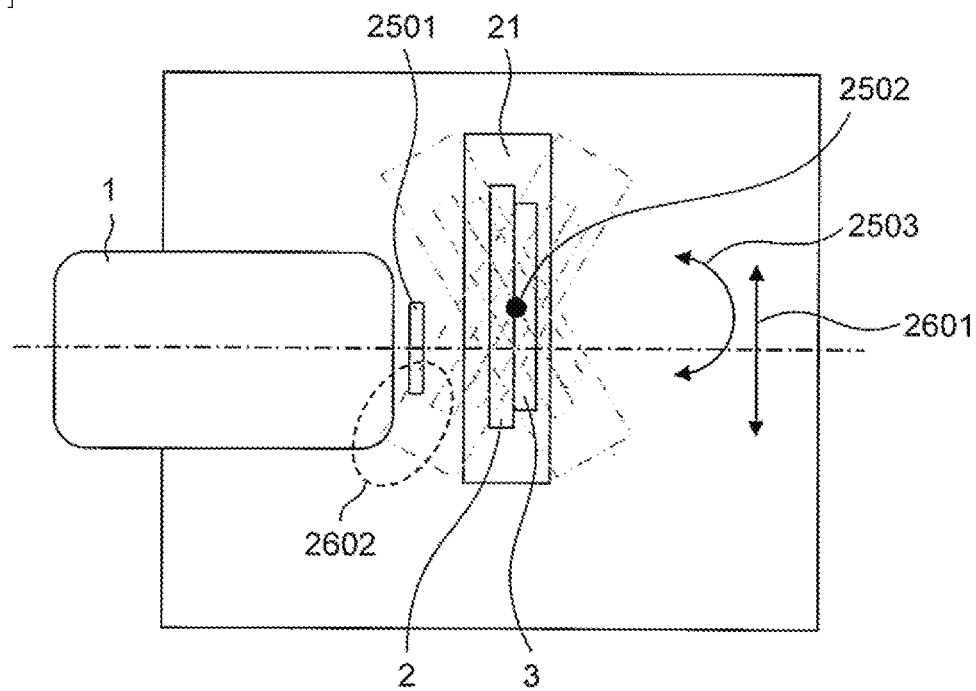

[FIG. 27]
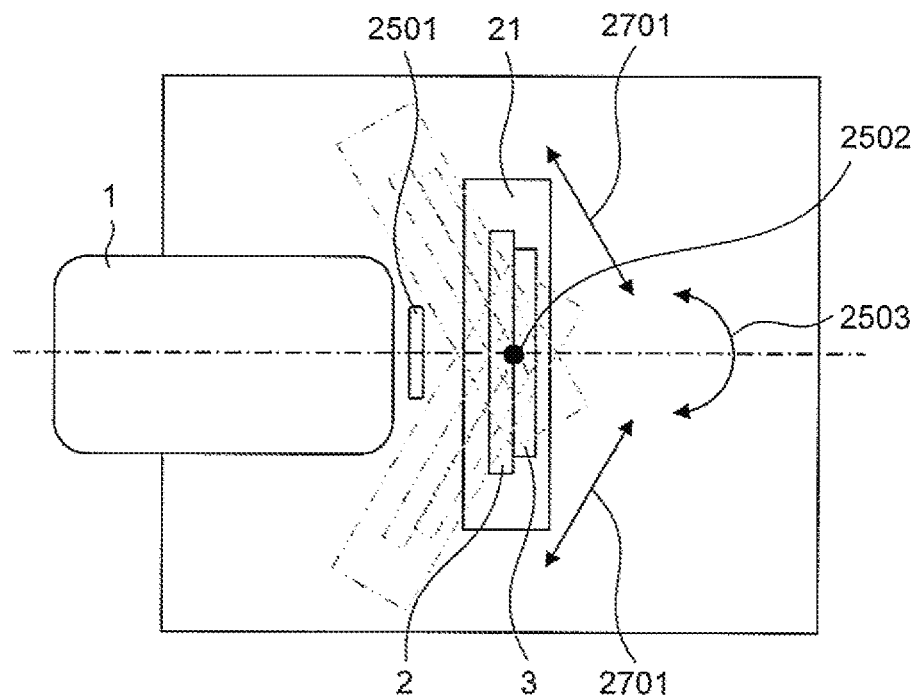
[FIG. 28]
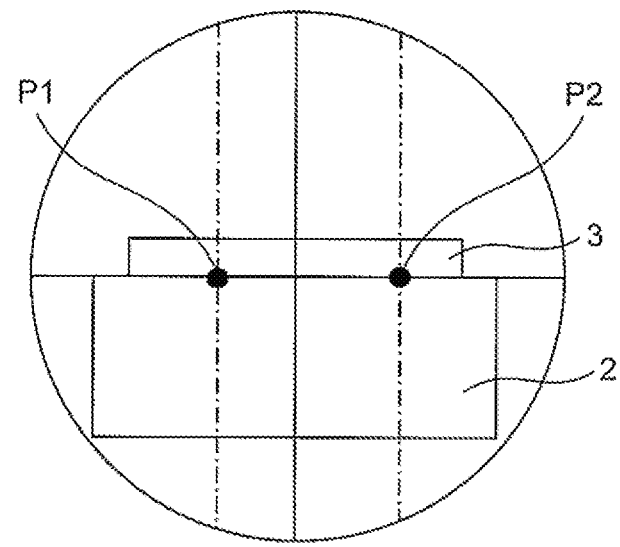

[FIG. 29]
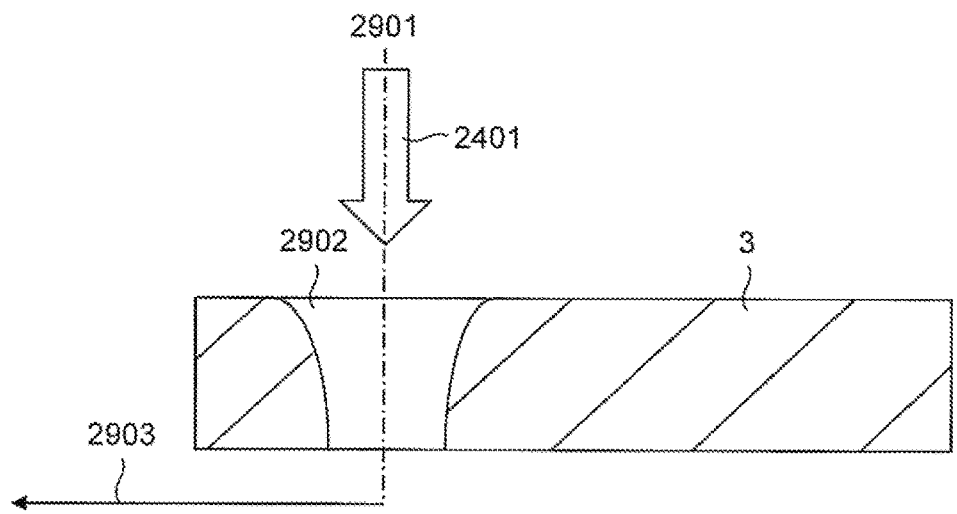
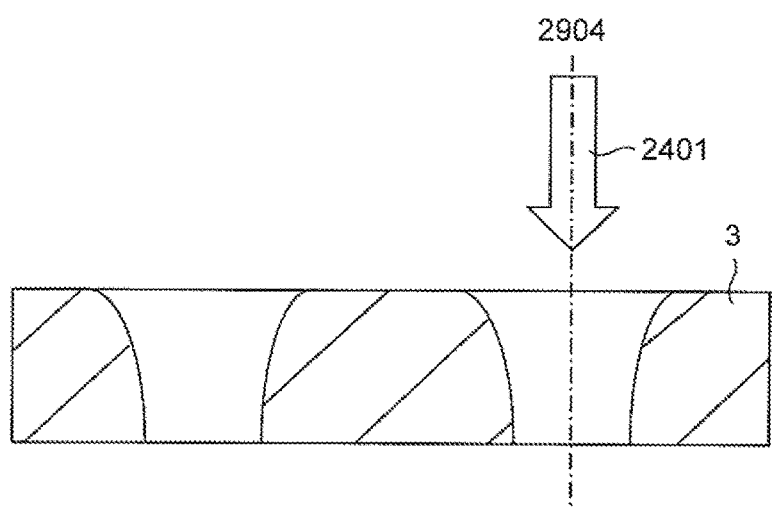

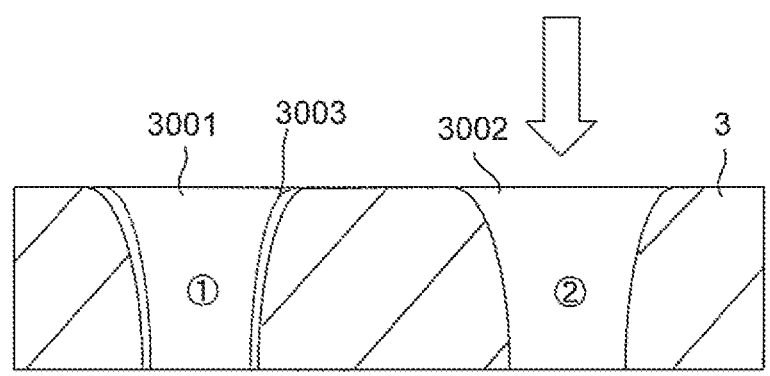
[FIG. 30A]
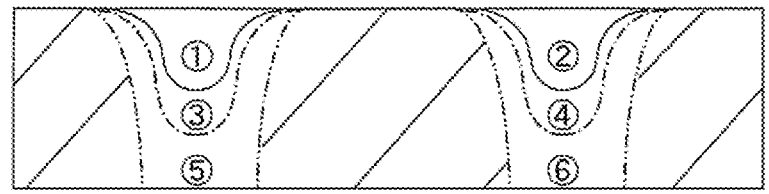
[FIG. 30B]
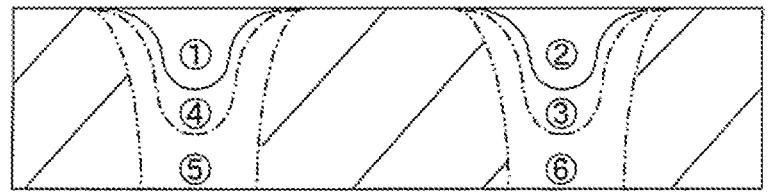
[FIG. 30C]
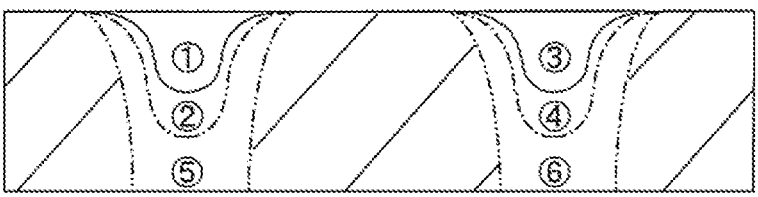
[FIG. 30D]
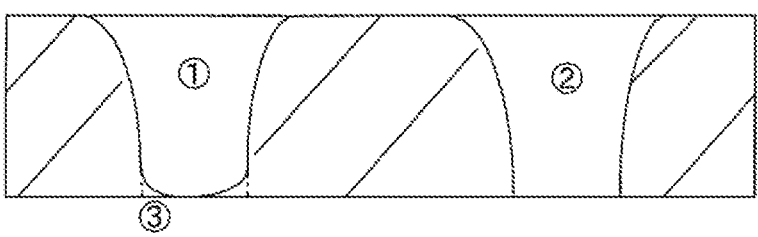
[FIG. 30E]
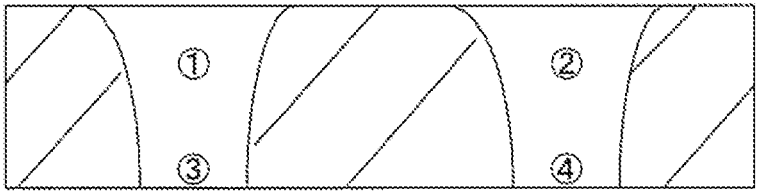
[FIG. 30F]

[FIG. 31A]
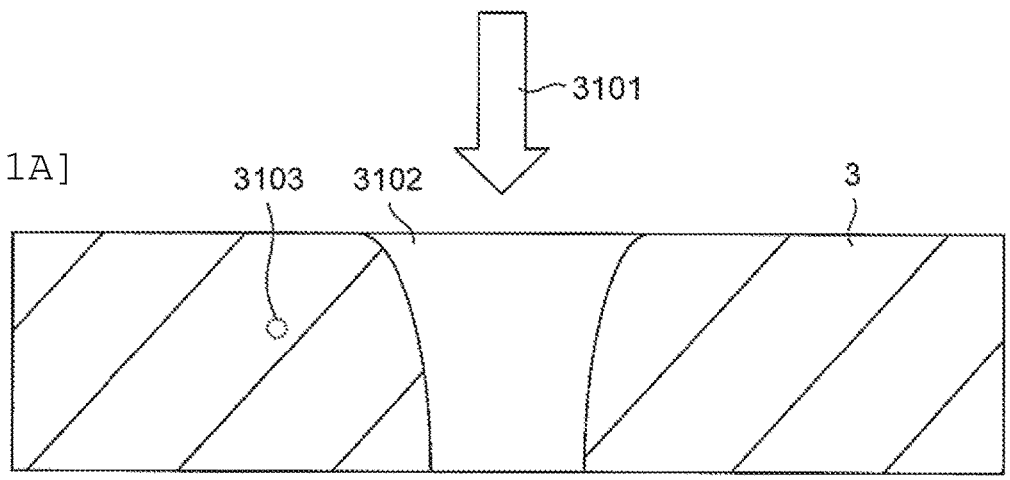
[FIG. 31B]
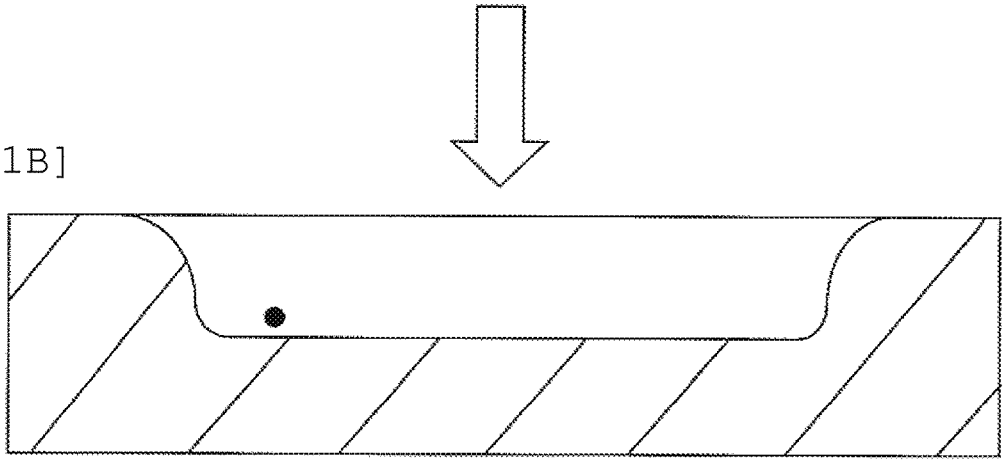
[FIG. 31C]
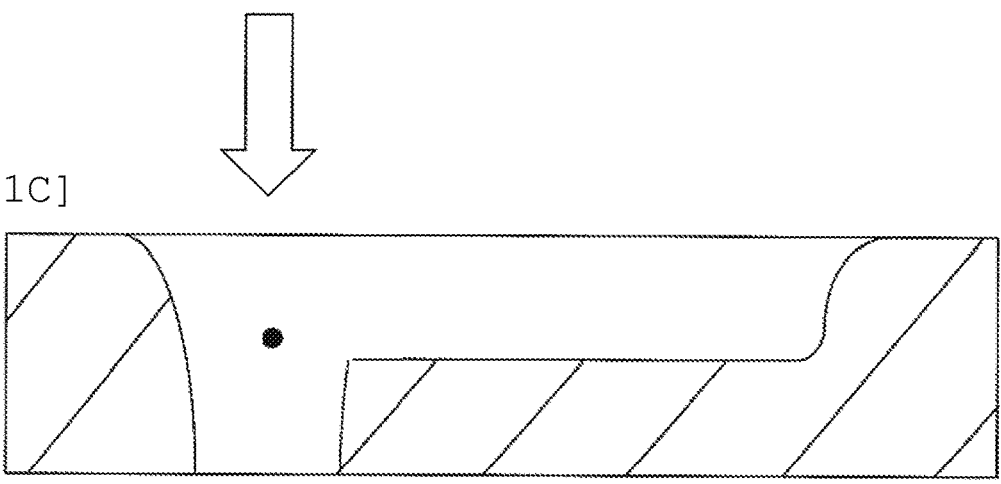

[FIG. 32A]
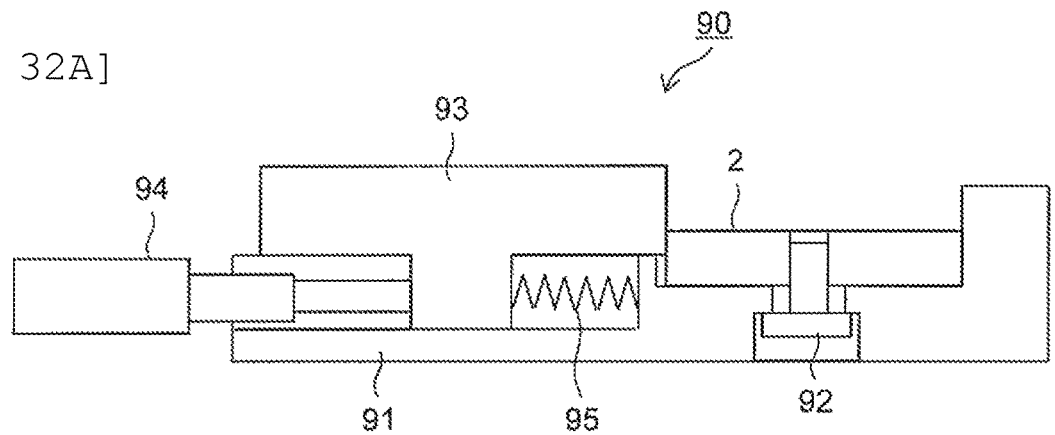
[FIG. 32B]
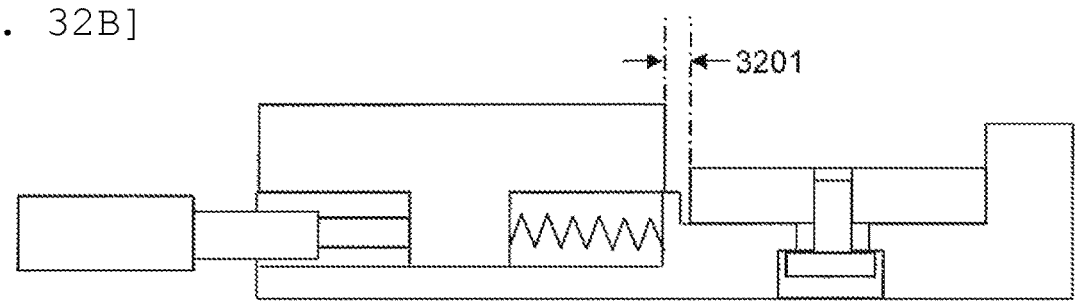
[FIG. 32C]
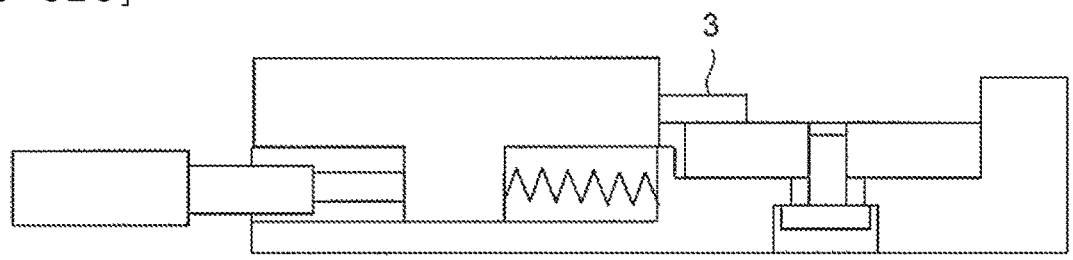

[FIG. 33]
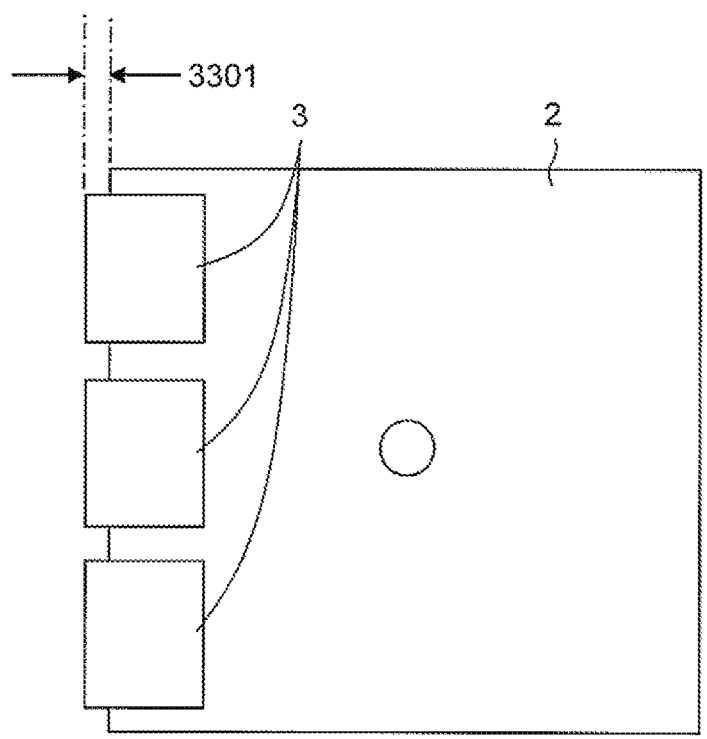
[FIG. 34]
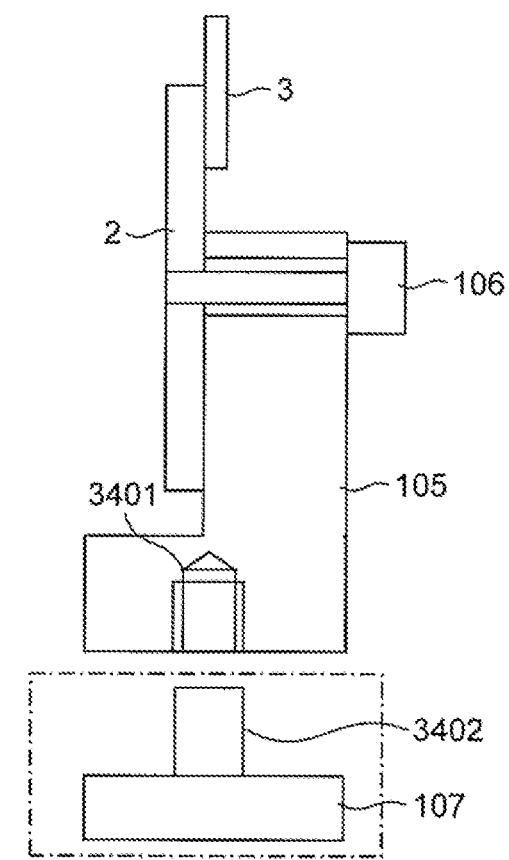

[FIG. 35]
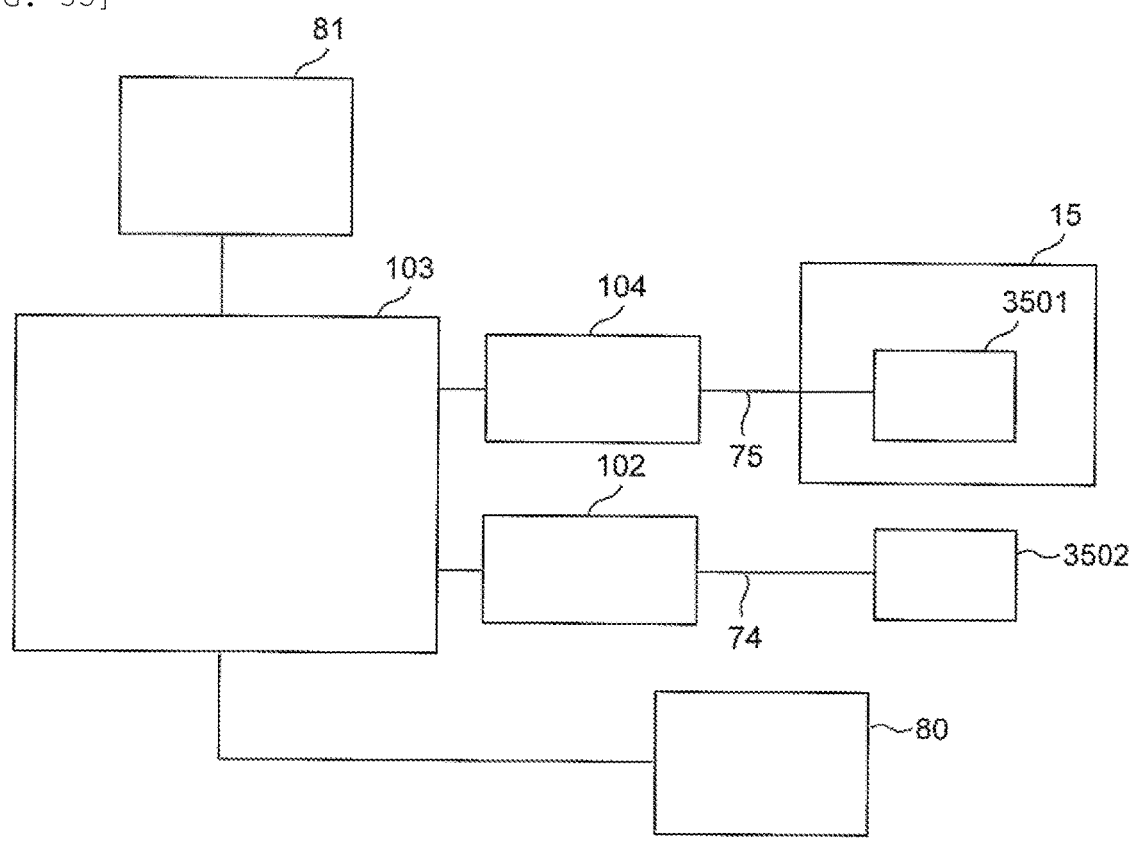

[FIG. 36]
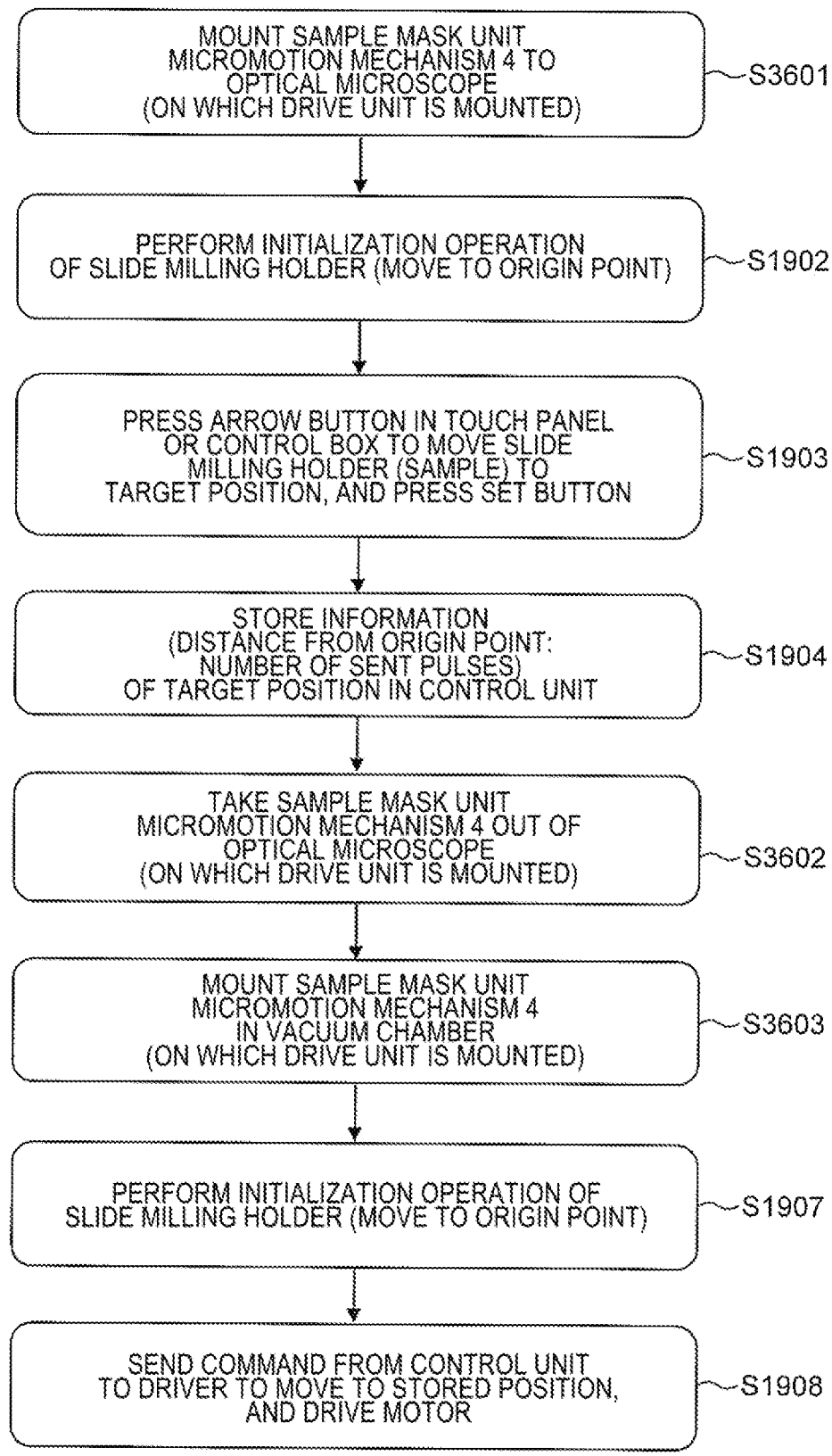

ION MILLING DEVICE AND ION MILLING METHOD

TECHNICAL FIELD

The present invention relates to an ion milling device and an ion milling method, for example, an ion milling device and an ion milling method to prepare a sample which is observed by a scanning electron microscope (SEM) or a transmission electron microscope (TEM).

BACKGROUND ART

An ion milling device is a device which emits an argon ion beam to a surface or a cross section of metal, glass, or ceramics to polish, and is suitable as a pre-treatment device for observing the surface or the cross section of a sample using the electron microscope.

In the related art, when observing the cross section of the sample using the electron microscope, an area around an observing portion is cut using a diamond cutter or a fret saw, and then the cross section is mechanically polished, and attached to a sample stand for the electron microscope to observe an image. In the case of observing a polymeric material or a soft sample such as aluminum, when mechanically polishing, the observing surface is crushed or a deep damage is left due to particles of a polishing material. In addition, for example, in the case of observing a rigid sample such as glass or ceramics, it is hard to perform the polishing. In the case of observing a composite formed by stacking soft materials and rigid materials, it is extremely hard to machine the cross section.

With this regard, using an ion milling the soft sample can be machined without crushing the surface shape, and the rigid sample and the composite material can be polished. In addition, the cross section in a mirror state can be effectively obtained. For example, PTL 1 discloses an ion milling device which emits the ion beam while inclining or rotating the sample to suppress irregularities in a streak shape in a machining surface.

CITATION LIST

Patent Literature

PTL 1: JP-A-2014-139938

SUMMARY OF INVENTION

Technical Problem

The inventor of the present application has extensively studied a machining method in a cross-sectional milling, and as a result found out the following knowledge.

The cross-sectional milling means a process in which a part of the ion beam is shielded by a mask (shielding plate) disposed on the upper portion of a sample, and the cross section of the sample along the end surface of the mask is subjected to sputtering. As a result, the cross section of the sample along the end surface of the mask is obtained.

However, in a case where there is a need to perform the machining with respect to a machining width (observation width) equal to or greater than an ion beam width or a plurality of machining points, a sample chamber is opened to the air, a machining position is changed, and the sample chamber is evacuated again, and then an additional machining is necessarily performed. When such an additional machining is performed, a throughput is lowered.

The invention has been made in view of the problems, and an object thereof is to provide a machining technology of obtaining a desired machining content while preventing a throughput reduction.

Solution to Problem

In order to solve the above problems, there is provided an ion milling device which machines a sample by emitting an ion beam to the sample of which at least a part is shielded by a mask. The ion milling device includes an ion source which emits the ion beam, a sample holder which holds the sample, and a sample sliding mechanism which slides the sample holder in a direction including a normal direction of an axis of the ion beam.

Advantageous Effects of Invention

According to the above configuration, it is possible to improve a throughput.

BRIEF DESCRIPTION OF DRAWINGS

FIG. 1 is a diagram illustrating a first configuration example of an ion milling device according to the embodiment.

FIGS. 2A and 2B are diagrams illustrating a configuration example of a main body of a sample mask unit 21.

FIGS. 3A and 3B are diagrams illustrating another configuration example of the sample mask unit 21.

FIG. 4 is a diagram for describing a method of arranging a cross section of a sample and a mask in parallel.

FIG. 5 is a diagram illustrating a configuration of a sample stage drawing mechanism 60.

FIG. 6 is a diagram illustrating a configuration example of an optical microscope 40 which is used to observe a shielding positional relation between a mask 2 and a sample 3.

FIG. 7 is a diagram illustrating a state where a sample mask unit micromotion mechanism 4 provided with the sample mask unit 21 is fixed on a fixing base 42.

FIG. 8 is a diagram for describing a method of matching the center of an ion beam with a portion of the sample 3 where a cross section polishing is desired to be performed.

FIG. 9 is a diagram for describing a method of mirror-polishing a cross section of the sample 3 using the ion beam.

FIG. 10 is a diagram illustrating a second configuration example of the ion milling device according to an embodiment which is different from the configuration of the first configuration example, capable of performing a cross-sectional milling and a planar milling.

FIGS. 11A and 11B are diagrams illustrating a configuration example of the sample mask unit micromotion mechanism 4 in which the sample mask unit 21 mounted in the ion milling device illustrated in FIG. 10 is installed.

FIG. 12 is a diagram for describing a rotation mechanism which is provided in a sample unit base 5 and rotates a mask unit fixing unit 52.

FIG. 13 is a diagram illustrating the rotation mechanism which rotates the mask unit fixing unit 52 by rotating a shaft coupling 53.

FIG. 14 is a diagram illustrating a state where the sample mask unit micromotion mechanism 4 is installed in the optical microscope 40 to adjust a machining position.

FIG. 15 is a diagram illustrating a configuration example of a rotation slope mechanism, and more particularly a diagram illustrating a configuration of portion A surrounded by a dotted line of FIG. 12.

FIG. 16 is a diagram illustrating a mechanism to rotate a rotating member 9 by the shaft coupling.

FIG. 17 is a diagram illustrating a configuration example of a slide milling holder (slide movement mechanism) 70 which slides the sample mask unit micromotion mechanism 4 in an X-axis direction.

FIG. 18 is a diagram illustrating a connection relation between devices when a machining position of the ion milling is set.

FIG. 19 is a flowchart for describing a procedure of a machining position setting process.

FIG. 20 is a diagram illustrating a layout example of buttons for setting a target position in a control BOX 80.

FIG. 21 is a diagram illustrating a first specific example of a machining region setting method of a wide region milling.

FIG. 22 is a diagram illustrating a second specific example of the machining region setting method of the wide region milling.

FIG. 23 is a diagram illustrating an exemplary operation screen for setting a machining region in the wide region milling.

FIGS. 24A to 24D are diagrams for describing a machining procedure of the sample 3 by the wide region milling.

FIG. 25 is a diagram illustrating a range of a slide operation and a reciprocating slope operation in a case where the slide movement mechanism (the slide milling holder 70) is installed below the rotating member 9.

FIG. 26 is a diagram illustrating a state when the sample mask unit 21 rotates and slides in a case where the slide movement mechanism (the slide milling holder 70) is installed below the rotating member 9.

FIG. 27 is a diagram illustrating a range of the slide operation and the reciprocating slope operation in a case where the slide movement mechanism (the slide milling holder 70) is installed on the rotating member 9.

FIG. 28 is a diagram illustrating a specific example of the machining region setting method of a multipoint milling.

FIG. 29 is a diagram for describing a first machining procedure of the sample 3 by the multipoint milling.

FIGS. 30A to 30F are diagrams for describing a second machining procedure to suppress a redeposition caused by the multipoint milling.

FIGS. 31A to 31C are diagrams illustrating an application of the wide region milling.

FIGS. 32A to 32C are diagrams for describing a method of fixing a plurality of samples having different thicknesses.

FIG. 33 is a diagram illustrating a state where a plurality of samples having different thicknesses are arranged and fixed to a mask.

FIG. 34 is a diagram illustrating a state where a sample having different thickness is machined and moved to an observation device for observation.

FIG. 35 is a diagram illustrating a connection relation between devices when the machining position of the ion milling is set according to a modification.

FIG. 36 is a flowchart for describing a procedure of a machining position setting process according to the modification.

DESCRIPTION OF EMBODIMENTS

In general, in a case where a machining is required to be performed with respect to a width (observation width) which is larger than an ion beam width and a plurality of machining points, a sample chamber is opened to the air, a machining position is changed, the sample chamber is evacuated and exhausted, and then an additional machining is performed. When such an additional machining is performed, a throughput is lowered. In addition, a redeposition is highly likely to occur in a machining surface at the first time.

Therefore, according to an embodiment of the invention, followings are realized. That is, a redeposition caused by the ion milling is extremely suppressed while improving the throughput, a desired width (a width wider than the ion beam width) of machining surface is generated on the sample, and/or a plurality of machining points (machining places) are generated on the sample. The present specification discloses at least a mechanism and a processing procedure in which a desired width of machining surface is generated and a plurality of machining points are generated by one time of machining process.

Hereinafter, embodiments of the invention will be described with reference to the drawings. In the embodiment, the description will be given about an ion milling device in which an ion source is mounted to emit an argon ion beam, but the ion beam is not limited to the argon ion beam, and various ion beams may be employed.

<Configuration Example of Ion Milling Device>

(i) First Configuration Example of Device

FIG. 1 is a diagram illustrating a first configuration example of an ion milling device 100 according to the embodiment. The ion milling device 100 of FIG. 1 includes a vacuum chamber 15, an ion source 1 which is attached to the upper surface of the vacuum chamber, a sample stage 8 which is provided on the front surface of the vacuum chamber 15, a sample unit base 5 which extends from the sample stage 8, a sample mask unit micromotion mechanism 4 which is placed on the sample unit base 5, a sample mask unit 21 which is placed on the sample mask unit micromotion mechanism 4, an evacuation system 6, and a linear guide 11 which is provided on the front surface of the vacuum chamber 15. A sample 3 and a mask 2 are placed on the sample mask unit.

The sample mask unit micromotion mechanism 4 is mounted in the sample unit base 5. When mounting, the lower surface of the sample mask unit micromotion mechanism 4 (a surface opposite to the mask surface where the ion beam is emitted) and the upper surface of the sample unit base 5 come into contact with each other, and fixed with a screw. The sample unit base 5 is configured to rotate and tilt at an arbitrary angle with respect to an optical axis of the ion beam. A tilting direction and a tilting angle of the rotation are controlled by the sample stage 8. The sample 3 disposed on the sample mask unit micromotion mechanism 4 can be set to form a predetermined angle with the optical axis of the ion beam by rotating and tilting the sample stage 8. Further, a rotation tilting shaft of the sample stage 8 and the upper surface of the sample (the lower surface of the mask) are matched in position, and a smooth machining surface is manufactured with efficiency. In addition, the sample mask unit micromotion mechanism 4 is configured to move front, back, right, and left in the vertical direction with respect to the optical axis of the ion beam (that is, an X direction and a Y direction).

The sample unit base 5 is disposed through the sample stage 8 (rotation mechanism) which is mounted on a flange 10 also serving as a part of the wall of the vacuum chamber 15. When the flange 10 is drawn out along the linear guide 11 to open the vacuum chamber 15 to the air, the sample unit base 5 is drawn out to the outer side of the vacuum chamber 15. In this way, a sample stage drawing mechanism is configured.

FIG. 2 is a diagram illustrating a configuration example of a main body of the sample mask unit 21. FIG. 2 (*a*) is a top view, and FIG. 2(*b*) is a side view. In the embodiment, an integrated configuration of at least a sample holder 23 and the rotation mechanism thereof, and the mask 2 and a fine adjustment mechanism thereof is called the sample mask unit (main body) 21. In FIG. 2, a sample holder rotation ring 22 and a sample holder rotation screw 28 are provided as the rotation mechanism of the sample holder 23. The sample holder 23 perpendicular to the optical axis of the ion beam can be rotated by rotating the sample holder rotation screw 28. In addition, the sample holder rotation ring 22 is configured to rotate by turning the sample holder rotation screw 28, and returns by a spring force of a reverse rotating spring 29.

The sample mask unit 21 includes a mechanism with which a position and a rotation angle of the mask can be finely adjusted, and is configured to be attached and detached with respect to the sample mask unit micromotion mechanism 4. In the embodiment, the sample mask unit 21 and the sample mask unit micromotion mechanism 4 are divided into two components, but may be configured in one component (in the embodiment, the description of the sample mask unit and the sample mask unit micromotion mechanism will be separately given in order to help with understanding).

The mask 2 is fixed to a mask holder 25 by a mask fixing screw 27. The mask holder 25 moves along a linear guide 24 by operating a mask fine adjustment mechanism (that is, a mask position adjusting unit) 26, and thus the positions of the sample 3 and the mask 2 are finely adjusted. The sample holder 23 is inserted to the sample holder rotation ring 22 from the lower side and fixed. The sample 3 is bonded and fixed to the sample holder 23 (for example, carbon paste, white wax, double-sided tape, etc.). A position of the sample holder 23 in the height direction is adjusted by a sample holder position control mechanism 30, and the sample holder 23 is tightly fixed to the mask 2.

FIG. 3 is a diagram illustrating another configuration example of the sample mask unit 21. In this configuration example, a sample holder metal fitting 35 is used to suppress the sample holder 23, and the other configurations are basically the same as those of the configuration example illustrated in FIG. 2. FIG. 3(*a*) illustrates a state where the sample holder 23 fixed with the sample 3 is mounted in the sample mask unit 21. FIG. 3(*b*) illustrates a state where the sample holder 23 fixed with the sample 3 is taken out of the sample mask unit 21.

FIG. 4 is a diagram for describing a method of arranging the cross section of the sample and the mask in parallel. The sample holder rotation screw 28 is turned to adjust the position in an X1 direction, and a fine adjustment is performed under the microscope such that the cross section of the sample 3 and a ridge line of the mask 2 are aligned in parallel as described below. At this time, the mask fine adjustment mechanism 26 is turned to make the cross section of the sample 3 slightly protrude from the mask (for example, to protrude about 50 µm).

FIG. 5 is a diagram illustrating a configuration of a sample stage drawing mechanism 60. The sample stage drawing mechanism 60 is configured of the linear guide 11 and the flange 10 which is fixed to the linear guide. The sample unit base 5 which is fixed to the sample stage mounted on the flange 10 is drawn out of the vacuum chamber 15 along the linear guide 11. With this operation, the sample mask unit micromotion mechanism 4 on which the sample mask unit 21 installed that is, the mask 2, the sample holder 23, and the sample 3 are integrally drawn out of the vacuum chamber 15 on the sample unit base 5.

In the embodiment, the sample mask unit micromotion mechanism 4 on which the sample mask unit 21 installed is configured to be detachably fixed to the sample unit base 5. Therefore, when the sample mask unit micromotion mechanism 4 on which the sample mask unit 21 installed is drawn out to the outer side of the vacuum chamber 15, the sample mask unit micromotion mechanism 4 on which the sample mask unit 21 installed is detachable from the sample unit base 5 (detachable standby of the sample mask unit 21).

FIG. 5 is a diagram illustrating a state where the sample mask unit micromotion mechanism 4 on which the sample mask unit 21 installed is detached in the detachable state. The detaching may be performed manually, or may be performed using an appropriate tool.

FIG. 6 is a diagram illustrating a configuration example of an optical microscope 40 with which a shielding positional relation between the mask 2 and the sample 3 is observed. As illustrated in FIG. 6, the sample mask unit micromotion mechanism is configured separately from the vacuum chamber 15, and may be disposed at an arbitrary place. Then, the optical microscope 40 includes a well-known loupe 12 and a loupe micromotion mechanism 13. Further, the optical microscope 40 includes a fixing base 42 to install the taken-out sample mask unit micromotion mechanism 4 on which the sample mask unit 21 installed onto an observation stand 41. Then, the sample mask unit micromotion mechanism 4 on which the sample mask unit 21 installed is installed on the fixing base 42 at reproducible positions which are set by positioning shafts and holes.

FIG. 7 is a diagram illustrating a state where the sample mask unit micromotion mechanism 4 on which the sample mask unit 21 installed is fixed onto the fixing base 42. In this way, since the sample mask unit micromotion mechanism 4 on which the sample mask unit 21 installed is fixed onto the fixing base 42, a portion of the sample where a cross section polishing is to be performed is matched with the center ("+" in FIG. 8) of the ion beam by a method to be described using FIG. 8.

FIG. 8 is a diagram for describing a method of matching a portion of the sample 3 where a cross section polishing is to be polished with the center of the ion beam. Photosensitive paper or copper foil is attached to the sample holder 23, and a mark (that is, the center of the ion beam) generated by the emitting of the ion beam and the center of the loupe are matched with each other by driving X2 and Y2 using the loupe micromotion mechanism 13. Therefore, the center of the ion beam and the center of the optical microscope correspond to each other in a one-to-one manner. Further, the position adjustment is performed at timing of a cleaning process. Then, the photosensitive paper or the copper foil used in matching positions is taken out of the sample holder 23, and the sample mask unit micromotion mechanism 4 on which the sample mask unit 21 installed is installed in the fixing base 42 after the sample 3 is mounted. The position of the sample mask unit micromotion mechanism 4 is adjusted in X3 and Y3 directions to match the portion where the cross section polishing is performed with the center of the loupe. Therefore, it is possible to match the center of the ion beam with the portion where the cross section polishing is performed. In this way, at the time of adjusting the shielding positional relation between the mask 2 and the sample 3, the sample mask unit micromotion mechanism 4 on which the sample mask unit 21 installed is taken out of the sample unit base 5 and mounted to the fixing base 42 of the optical microscope 40. The shielding positional relation of the mask 2 with respect to the sample 3 is adjusted by the mask position adjusting unit (mask fine adjustment mechanism).

FIG. 9 is a diagram for describing a method of mirror-polishing the cross section of the sample 3 using the ion beam. When the argon ion beam is emitted, the sample 3 not covered with the mask 2 can be removed in a depth direction along the mask 2, and the surface of the cross section of the sample 3 can be mirror-polished.

In this way, the sample mask unit micromotion mechanism 4 on which the sample mask unit 21 installed including the mask 2 of which the shielding positional relation with respect to the sample is adjusted at the time of ion milling, is returned to the sample unit base 5, and mounted thereto.

As described above, the ion milling method is configured such that, at the time of adjusting the shielding positional relation between the mask 2 and the sample 3, the sample mask unit micromotion mechanism 4 on which the sample mask unit 21 installed is taken out of the sample unit base 5 and mounted to the fixing base 42 of the optical microscope 40, and the shielding positional relation with respect to the sample 3 of the mask is adjusted. Further, the sample mask unit micromotion mechanism 4 on which the sample mask unit 21 installed including the mask 2 of which the shielding positional relation with respect to the sample is adjusted, is returned into the vacuum chamber 15 at the time of ion milling, and mounted to the sample unit base 5.

(ii) Second Configuration Example of Device

FIG. 10 is a diagram illustrating a second configuration example of the ion milling device 100 according to the embodiment which is different from the configuration of the first configuration example, and capable of performing a cross-sectional milling and a planar milling.

The ion milling device 100 includes the vacuum chamber 15, a machining observation window 7 which is provided in the upper surface of the vacuum chamber 15, the ion source 1 which is provided in the left side surface (or may be in the right side surface) of the vacuum chamber 15, the flange 10 which is provided in the side surface different from the side surface where the ion source 1 is provided, the sample stage 8 which is provided on the flange 10, the sample unit base 5 which extends from the sample stage 8, the sample mask unit micromotion mechanism 4 and the sample mask unit 21 which are mounted on the sample unit base 5, the sample stage 8 which is provided on the front surface of the vacuum chamber 15, a shutter 101 which is provided between the sample and the machining observation window 7, and the evacuation system 6. The sample mask unit 21 includes the mask 2, and the sample 3 is placed therein.

The shutter 101 is installed to prevent sputtered particles from depositing on the machining observation window 7. The vacuum chamber 15 is formed in a box shape or a similar shape which forms a space to make a normal vacuum atmosphere. The machining observation window 7 is provided in the upper side of the box (a direction opposite to a direction of the gravitational field under a gravitational environment). The ion source 1 is provided in a side wall surface of the box (the surface adjacent to the upper surface of the box in a direction perpendicular to the gravitational direction). In other words, the machining observation window 7 is provided in the wall surface of the vacuum chamber. Further, the optical microscope (including the observation window) or an electron microscope may be installed in the opening for the machining observation window in addition to the window which can vacuum-seal.

FIG. 11(a) is a diagram illustrating a configuration example of the sample mask unit micromotion mechanism 4 on which the sample mask unit 21 installed which is mounted in the ion milling device illustrated in FIG. 10. The basis configurations are the same as those illustrated in FIGS. 2 and 3 except that a mask unit fixing unit 52 is provided in the sample mask unit micromotion mechanism 4 on which the sample mask unit 21 is mounted. In addition, a fixing method of the sample holder 23 is different from the configuration of FIG. 2. In other words, a key portion 231 of the sample holder 23 is inserted to the sample holder rotation ring 22 (a shape obtained by dividing the ring in half) from the lower side, and fixed with a screw (see FIG. 11(b)). With such a fixing method, the machining surface of the sample 3 can be observed from the machining observation window 7.

FIG. 12 is a diagram for describing the rotation mechanism which is provided in the sample unit base 5 to rotate the mask unit fixing unit 52. In the sample unit base 5, there is provided a rotating member 9 in which a sample holding member (a member to hold the sample including the sample mask unit micromotion mechanism 4) can be placed. The rotating member 9 serves as a support base to support the sample holding member. The sample unit base 5 is constituted by the rotating member 9, a gear 50, and a bearing 51. The sample mask unit micromotion mechanism 4 is brought into contact with a fixing surface (rear surface) of the sample mask unit micromotion mechanism 4 and the upper surface of the rotating member 9 of the sample unit base 5, and mounted by being fixed with a screw from the mask unit fixing unit 52. The sample unit base 5 does not rotate and tilt, but is configured to rotate and tilt by the rotating member 9 mounted in the sample unit base 5 to form an arbitrary angle with the optical axis of the ion beam which is emitted in the side surface direction of the vacuum chamber 15. A tilting direction and a tilting angle of the rotation is controlled by the sample stage 8.

Herein, as a method of rotating and tilting the rotating member 9 of the sample unit base 5, there are a method of rotating the sample stage 8 as illustrated in FIG. 12 and a method of rotating a shaft coupling 53 as illustrated in FIG. 13, and both methods may be employed. The sample 3 disposed on the sample mask unit micromotion mechanism 4 can be set at a predetermined angle with respect to the optical axis of the ion beam by rotating and tilting the rotating member 9 of the sample unit base 5. Further, a rotation axis of the rotating member 9 of the sample unit base 5 and a position of the upper surface (the lower surface of the mask) of the sample are matched to each other to prepare a smooth machining surface with efficiency.

FIG. 14 is a diagram illustrating a state where the sample mask unit micromotion mechanism 4 is installed on the optical microscope 40 to adjust the machining position. Further, the installation of the device and other units to the optical microscope 40 may be performed not using the mask unit fixing unit 52 but using the lower surface of the sample mask unit micromotion mechanism 4. FIG. 14 is different from FIG. 6 in that the loupe micromotion mechanism 13 adjusting the center of the beam and the center of the loupe is installed on the fixing base 42. The loupe micromotion mechanism 13 may be configured by employing any one of this example and the example of FIG. 6. Other operations are the same as those of the example of FIG. 6.

FIG. 15 is a diagram illustrating a configuration example of a rotation slope mechanism, and more specifically a diagram illustrating a configuration of portion A surrounded by a dotted line of FIG. 12. The ion milling device according to the second configuration example (FIG. 10) has a function of rotating a sample toward the rotation slope mechanism as illustrated in FIG. 15, and there is provided a tilting mechanism which has a rotation tilting shaft in the vertical direction to an ion beam axis. The rotation slope mechanism is configured to rotate the rotating member 9 (not illustrated in FIG. 15) using a rotation force of a motor 55 through a shaft and the gear 50. With this configuration, it is possible to realize an eccentric mechanism which displaces the ion beam axis and rotation axis of the sample mask unit micromotion mechanism 4 when the tilting angle is 90 degrees. Further, as illustrated in FIG. 16, the shaft coupling may be used. However, in a case where the shaft coupling is used, the shaft coupling is installed in a rotation tilting unit as illustrated in FIG. 16, and the eccentric mechanism (moves in the Y-axis direction) is desirably installed in the lower portion of the rotating member 9 of the sample unit base 5.

As illustrated in FIGS. 15 and 16, the ion milling device may have a function of rotating the sample. The incident angle of ion beam and an eccentric amount are arbitrarily set such that the planar milling (smoothening a surface (when the tilting angle of the sample stage is 90 degrees) perpendicular to the ion beam axis) may be performed while performing the cross-sectional milling (milling the sample through a mask to make the surface smooth).

<Slide Movement Mechanism to Realize Wide Region Milling and Multipoint Milling>

Hereinafter, the description will be given about a slide movement mechanism to realize a wide region milling and a multipoint milling in the ion milling device 100 according to the configuration of FIGS. 1 and 10 (including any one of FIGS. 12, 13, 15, and 16). Herein, the wide region milling means a machining which is performed on a region on the sample having a width wider than the ion beam width. In addition, the multipoint milling means a machining which is performed on a plurality of places on the sample (in particular, an automatic machining performed on a plurality of places in this embodiment).

The ion milling device 100, which is possible to execute the wide region milling and the multipoint milling, includes the slide movement mechanism (also referred to as a slide driving mechanism) which is movable (slidable) in a vertical direction with respect to the optical axis of the ion beam, and necessarily slides the sample mask unit 21 in the vacuum chamber. A direction of sliding movement and the edge of the mask 2 are desirably arranged in parallel. Further, the position of the rotation tilting shaft desirably does not move even when the sliding movement is performed (the reason will be described below with reference to FIGS. 25 to 27). Such an ion milling device may be realized by the following configuration. Further, the description in the embodiment will be given about a case where a motor (a drive source in an X-axis direction) is installed in the vacuum chamber (at the time of driving the motor). However, the motor may be installed outside the chamber.

In order to perform the wide region milling and the multipoint milling, the sample mask unit micromotion mechanism 4 is desirably driven in the X-axis direction (see FIG. 10) in the vacuum chamber 15 in addition to the configuration of FIG. 10. Specifically, it is possible to drive the sample mask unit micromotion mechanism 4 in the X direction in the vacuum chamber 15 by using a motor as the drive source of the X direction.

FIG. 17 is a diagram illustrating a configuration example of a slide milling holder (slide movement mechanism) 70 to slide the sample mask unit micromotion mechanism 4 in the X-axis direction. In the slide milling holder 70, there is provided an X gear 71 in a drive axis of the sample mask unit micromotion mechanism 4 in the X-axis direction. In addition, a motor unit 72 is installed on the lower surface side of the sample mask unit micromotion mechanism 4. The motor unit 72 is constituted by a motor, an M gear 73, and a cover. M gear 73 is assembled into the rotation axis of the motor (the M gear 73 may not be directly attached to the rotation axis of the motor). The M gear is a final stage gear which is through a plurality of gear stages and comes into contact with the X gear 71. The sample mask unit micromotion mechanism 4 and the motor unit 72 may be configured integrally or separately. The description herein will be given about the separate type. In the separate type, a normal cross-sectional milling is possible (manually adjusting method) even after the motor unit 72 is taken out.

The sample mask unit micromotion mechanism 4 and the motor unit 72 are assembled by a shaft and a hole for positioning while keeping a reproducible positional relation, and fixed by a screw. With this configuration, the X gear 71 of the sample mask unit micromotion mechanism 4 and the M gear 73 of the motor unit 72 come into contact with each other. Therefore, when the motor starts to rotate, the X gear 71 rotates through the M gear 73, and a drive shaft of the sample mask unit micromotion mechanism 4 in the X-axis direction rotates. Therefore, the sample 3 (the sample 3 fixed to the sample mask unit 21) starts to move (slide) in the X-axis direction. With this configuration, it is possible to realize the ion milling device in which the rotation tilting shaft does not move while performing sliding. Further, the slide milling holder 70 is disposed on the upper portion of the rotating member 9 in the ion milling device as illustrated in FIGS. 10 and 12. In addition, the slide milling holder 70 is placed on the sample unit base 5 in the ion milling device illustrated in FIG. 1.

<Processing Content from Machining Target Position Setting to Machining Start>

FIG. 18 is a diagram illustrating a connection relation between devices when a machining position of the ion milling device is set. FIG. 19 is flowchart for describing a procedure of a machining position setting process. The description will be given with reference to FIGS. 18 and 19 about a method of operating of the ion milling using the slide milling holder 70 where the sample mask unit micromotion mechanism 4 on which the sample mask unit 21 installed and the motor unit 72 are assembled (an operation in a state where the sample 3 is disposed on the sample mask unit 21). Further, power for driving the motor is supplied from a control unit 103 of the main body of the ion milling device 100 through a motor cable (out) 74 and the motor cable (in) 75.

(i) Step 1901

A user (operator) mounts the slide milling holder 70 to the fixing base 42 of the optical microscope 40 (see FIG. 14), and connects the motor cable (out) 74 extending from the control unit 103 through an optical microscope driver 102 to the motor unit of the slide milling holder 70.

(ii) Step 1902

When the machining position setting process starts after Step 1901, the control unit 103 performs an initialization operation of the slide milling holder 70. Specifically, the slide milling holder 70 mounted in the optical microscope 40 is moved to a reference position (for example, an origin point).

(iii) Step 1903

After completing the initialization operation, the user presses an arrow button provided on an operation unit (for example, a touch panel) 81 or on a control BOX (for example, installed away from the control unit 103, and close to the optical microscope 40) 80, moves the slide milling holder 70 provided with the sample 3 to a target position (machining position) (the X-axis direction: X3 of FIG. 8), and presses a set button which is provided on the control BOX 80. The movement to the X-axis direction is performed by driving the motor. Further, the adjustment other than the X-axis movement is the same as the operation method described using FIG. 8. When moving to the X-axis direction, the control unit 103 acquires information on the target position (information on the number of pulses corresponding to the number of times of pressing the arrow button to move the slide milling holder 70 to the target position). The numerical value of the target position (for example, distance) may be set. In this case, for example, the set numerical value (distance) is converted into the number of pulses.

(iv) Step 1904

The control unit 103 acquires information on the target position acquired in Step 1903 (a distance from the origin position: the number of pulses generated when moving to the target position), and stores the information in a memory (not illustrated) in the control unit 103.

(v) Step 1905

When the setting of the target position is completed using the optical microscope 40, the user takes the motor cable (out) 74 connected to the slide milling holder 70 out of the motor unit 72, and takes the slide milling holder 70 out of the fixing base 42 of the optical microscope 40. The control unit 103 detects that the motor cable (out) 74 is taken out.

(vi) Step 1906

Next, the user mounts the slide milling holder 70 taken out of the optical microscope 40 on the rotating member 9 of the ion milling device installed in the vacuum chamber 15 (in the case of the ion milling device of FIG. 12) or on the sample unit base 5 (in the case of the ion milling device of FIG. 1). Then, the user connects the motor cable (in) 75 extending from the control unit 103 to the motor unit 72 of the slide milling holder 70 through a vacuum chamber driver 104. The control unit 103 detects that the motor unit 72 of the slide milling holder 70 is connected to the motor cable (in) 75.

Then, the user closes the sample stage drawing mechanism 60, and evacuates the vacuum chamber 15 using the evacuation system 6 to make a vacuum state.

(vii) Step 1907

The control unit 103 performs the initialization operation of the slide milling holder 70. Specifically, a reference position (for example, the origin point) of the slide milling holder 70 mounted in the ion milling device is moved.

The user injects argon gas between electrodes in the ion source 1, and applies a high voltage thereto to start discharging. In this state, an acceleration voltage is applied, and the ion beam is emitted to start machining.

(viii) Step 1908

The control unit 103 reads out the information on the target position which is stored in the memory, controls the vacuum chamber driver 104 such that the machining position on the sample is set to the target position, and drives the motor of the motor unit 72.

In the ion milling device, the rotating member 9 (in the case of the configuration example of the ion milling device of FIG. 10) or the sample stage 8 (in the case of the configuration example of the ion milling device of FIG. 1) is tilted at an arbitrary angle in a reciprocal manner, and performs a slide reciprocating drive of the slide milling holder 70 (see FIG. 24) to obtain a wide machining surface (a range of the slide reciprocating drive is up to the position set below the optical microscope 40). Further, the slide reciprocating drive may be performed continuously or intermittently. Further, as an example of an intermittent drive, an operation of 0.1 mm of sliding after 10 seconds machining→ . . . →0.1 mm of sliding after 10 seconds machining may be considered, and a holding (machining) time and a slide distance may be input.

<Processing Content from Machining Target Position Setting to Machining Start (Modification)>

FIG. 35 is a diagram illustrating a connection relation between devices when the machining position of the ion milling device is set according to a modification. FIG. 36 is a flowchart for describing a procedure of a machining position setting process according to the modification. The description will be given with reference to FIGS. 35 and 36 about a method of operating the ion milling (an operation from a state where the sample 3 is disposed on the sample mask unit 21) using the sample mask unit micromotion mechanism 4 on which the sample mask unit 21 installed.

In FIG. 18, the slide milling holder 70 having the motor unit 72 is moved between the vacuum chamber 15 and the optical microscope 40 (using the same motor). However, in the modification, the drive unit (including the motor) is provided in each of the vacuum chamber 15 and the optical microscope 40. Therefore, there is no need to move the slide milling holder 70 itself between the vacuum chamber 15 and the optical microscope 40. Therefore, in this case, the sample mask unit micromotion mechanism. 4 on which the sample mask unit 21 installed may be moved back and forth between the vacuum chamber 15 and the optical microscope 40, taking in and out the cable does not necessary at this time. In the procedure of the machining position setting process illustrated in FIG. 36, Steps 3601, 3602, and 3603 are performed instead of Steps 1901, 1905, and 1906 of FIG. 19. Hereinafter, the description will be given only about Steps 3601 to 3603 which are different from FIG. 19.

(i) Step 3601

The user (operator) mounts the sample mask unit micromotion mechanism 4 in the optical microscope 40 which includes the drive unit. To a motor unit 3502 on a side near the optical microscope 40, the motor cable (out) 74 which extends from the control unit 103 through the optical microscope driver 102 is connected. Therefore, the connection procedure of the motor cable (out) is unnecessary unlike to Step 1901 of FIG. 19 (only mounted to the optical microscope 40 of the sample mask unit micromotion mechanism 4).

(ii) Step 3602

When the setting of the target position is completed using the optical microscope 40, the user takes the sample mask unit micromotion mechanism 4 out of the optical microscope 40 which includes the drive unit. At this time, the control unit 103 detects that the sample mask unit micromotion mechanism 4 is taken out of the optical microscope 40, and completes the positioning in the optical microscope 40.

(vi) Step 3603

When the positioning in the optical microscope 40 is completed, the user mounts the sample mask unit micromotion mechanism 4 taken out of the optical microscope 40 to the vacuum chamber 15 which includes the drive unit. To a motor unit 3501 on a side near the vacuum chamber 15 the motor cable (in) 75 extending from the control unit 103 through the vacuum chamber driver 104 is connected. Therefore, the connection procedure of the motor cable (in) is unnecessary unlike Step 1906 of FIG. 19 (only mounted to the vacuum chamber 15 of the sample mask unit micromotion mechanism 4). At this time, the control unit 103 detects that the sample mask unit micromotion mechanism 4 is mounted to the drive unit of the vacuum chamber 15. Then, the user closes the sample stage drawing mechanism 60, and evacuates the vacuum chamber 15 using the evacuation system 6 to make a vacuum state.

<Specific Machining Region Setting Method at Wide Region Milling>

Herein, more specifically, the description will be given about a method of setting a machining region in a case where the wide region milling is performed. FIG. 20 is a diagram illustrating a layout example of buttons for setting the target position in the control BOX 80. FIGS. 21 and 22 are diagrams illustrating a specific example of the machining region setting method of the wide region milling.

In a case where the wide region milling is performed, the user moves the sample 3 (the sample mask unit 21) using the control BOX 80 (or an operation panel unit 80) (pressing an L button 76 (left) and an R button 77 (right) in FIG. 20) while keeping an eye on (or timely looking at) the optical microscope 40, and sets both ends E1 and E2 of a region (a machining region 2101) which is machined as illustrated in FIG. 21 (pressing a SET button 78 in FIG. 20).

In a method of setting a machining region of the wide region milling, the both ends of a region which is machined may be set as illustrated in FIG. 21. As illustrated in FIG. 22, a center Cl of the region which is machined may be set (the machining region 2101). After setting, a machining region may be set by inputting numerical values (for example, a range of ±2 mm from the center) to the operation unit 81 (or the control BOX 80) (in this case, a function of inputting numerical values to a machining region is added besides the buttons of FIG. 20) so as to machine (slide reciprocating drive) the setting range (see FIG. 24). The machining region of the wide region milling may be selected by any one of the positions of both ends of the machining region and the center position of the machining region as illustrated in the operation screen of FIG. 23, so that operability is improved. The machining process (milling) is the same in any case where the machining region is set using "the positions of both ends" and a case where the machining region is set using "the center position".

Further, as illustrated in FIG. 20, a multipoint milling select button and a wide region milling select button are provided in the control BOX 80, and any one or both can be selected.

<Machining Procedure in Wide Region Milling>

FIG. 24 is a diagram for describing a machining procedure of the sample 3 in the wide region milling.

When the wide region milling is performed, an emission absolute position of an ion beam 2401 is fixed, and the sample 3 slides reciprocally in a slide range 2403 by the slide movement mechanism (the slide milling holder 70), and thus a wide machining surface 2402 is prepared (see FIG. 24(*a*)).

Therefore, in a state where the ion beam 2401 is emitted, the slide movement mechanism moves the sample 3 from the center to the right end of the machining surface 2402 (see FIG. 24(*b*)), and moves the sample from the right end to the left end of the machining surface 2402. During moving the sample 3 from the right end to the left end of the machining surface 2402, the ion beam 2401 is emitted to the sample 3.

Subsequently, the slide movement mechanism slides the sample 3 from the left end to the right end of the machining surface 2402 (see FIG. 24(*c*)). During moving the sample 3 from the left end to the right end of the machining surface 2402, the ion beam 2401 is emitted to the sample 3.

The above slide operation is repeatedly performed until the end of the machining (see FIGS. 24(*d*) and 24(*c*)).

<Reason Why Slide Movement Mechanism is Provided on Rotating Member>

According to the configuration of the device described above, the slide movement mechanisms (the slide milling holder 70) is provided on the rotating member 9 (the sample stage 8 in a case where the configuration of the ion milling device of FIG. 1 is employed). In other words, the machining position on the reciprocating slope axis and the upper surface of the sample is always the same. Therefore, even when the sample 3 is driven to slide while reciprocating and tilting, interference hardly occurs in the mechanism units (the ion source 1, the ion beam probe, etc.) in the sample chamber. Accordingly, the limitation of the slide range is also less.

FIG. 25 is a diagram illustrating a range of a reciprocating slope operation of the sample in the case of a normal cross-sectional milling (a configuration where the slide movement mechanism is not provided). FIG. 26 is a diagram illustrating a range of the slide operation and the reciprocating slope operation in a case where the slide movement mechanism (the slide milling holder 70) is installed below the rotating member 9. FIG. 27 is a diagram illustrating a range of the slide operation and the reciprocating slope operation in a case where the slide movement mechanism (the slide milling holder 70) is installed on the rotating member 9.

In the case of the normal cross-sectional milling (FIG. 25), the sample mask unit 21 does not slide to move, and thus the position of a rotation tilting shaft (a rotation shaft of the rotating member 9) 2502 is fixed, and a reciprocating slope operation 2503 is performed within the fixed range. Therefore, the sample mask unit 21 performing the reciprocating slope operation 2503 does not receive interference from an ion beam probe 2501 and the ion source 1.

On the other hand, as illustrated in FIG. 26, in a case where the slide movement mechanism (the slide milling holder 70) is installed below the rotating member 9, the position of the rotation tilting shaft 2502 also slide when the sample mask unit 21 slides. In addition, the sample mask unit 21 performs the reciprocating slope operation 2503 while the rotation tilting shaft 2502 slides (a slide direction 2601 is constant). Therefore, the sample mask unit 21 interferes with the ion beam probe 2501 and the ion source 1 depending on the position of the rotation tilting shaft 2502 (interference place 2602), and a sufficiently wide machining width may not be obtained.

Therefore, as illustrated in FIG. 27, the slide movement mechanism (the slide milling holder 70) is installed on the rotating member 9. In this case, the position of the rotation tilting shaft 2502 is fixed even when the sample mask unit 21 slides. Therefore, a slide direction 2701 changes depending on the tilting angle of the reciprocating slope operation 2503, but the sample mask unit 21 does not cause interference with the ion beam probe 2501 and the ion source 1 during the slide operation and the reciprocating slope operation. Therefore, a wide slide width can be obtained at the time of sliding, and a wide machining width can be obtained. Further, if the multipoint milling is performed in the configuration of FIG. 26, the position of the rotation tilting shaft 2502 changes as described above in a case where a position separated from the ion beam axis is machined. Therefore, there is a problem in that a milling profile is not normally formed (the milling profile is formed asymmetrically in the horizontal direction).

<Specific Method of Setting Machining Place in Multi-point Milling>

Herein, more specifically, the description will be given about a method of setting a machining place in a case where the multipoint milling is performed. FIG. 28 is a diagram illustrating a specific example of the machining region setting method of the multipoint milling.

Even in a case where the multipoint milling (automatic machining on a plurality of places) is performed, the sample 3 (the sample mask unit 21) is moved in the control BOX 80, or the operation unit 81 (press the L button 76 (left) and the R button (right)) while keeping eye on the optical microscope 40 (or timely looking at) similarly to the case of the wide region milling. More specifically, as illustrated in FIG. 28 (in the case of two or more machining places), a plurality of positions P1 and P2 to be machined are set (press the SET button 78). Further, even in a case where the multipoint milling is performed, the mask 2 is desirably fixed to make the edge thereof arranged in parallel to a sliding direction.

After setting the machining position, the motor cable (out) 74 is taken out of the slide milling holder 70, and the slide milling holder 70 is taken out of the fixing base 42. Then, the slide milling holder 70 is mounted in the rotating member 9 or the sample unit base 5, and the motor cable (in) 75 is connected to the slide milling holder 70.

The sample stage drawing mechanism 60 is closed, and the vacuum chamber 15 is evacuated by the evacuation system 6 to be a vacuum state. In addition, an argon gas is injected between the electrodes in the ion source 1, a high voltage is applied, and the discharging is started. In that state, the acceleration voltage is applied, the ion beam is emitted, and the machining starts (at the same time, the reciprocating slope operation is performed).

<Procedure of Machining by Multipoint Milling>

FIG. 29 is a diagram for describing a first machining procedure of the sample 3 by the multipoint milling. FIG. 30 is a diagram for describing a second machining procedure to suppress the redeposition by the multipoint milling.

As illustrated in FIG. 29 (in the case of two machining places), when the machining is completed at a first machining position 2901 (a machining surface 2902), the slide milling holder 70 is automatically driven to slide (in X3 direction) and moves to a second machining position 2904 (a slide driving direction 2903), and the machining starts. In a case where a third machining position and the subsequent positions are selected, the above process is performed. With the above machining method, the multipoint milling (automatic machining on a plurality of places) can be realized.

However, in a case where the machining is performed with the method, a redeposition 3003 may be generated in the surface of a first machining surface 3001 as illustrated in FIG. 30 (*a*). As a countermeasure, for example, in a case where each of the machining positions is set to be machined for 3 hours, the machining is performed as follows: one hour machining at the first machining position 2901 (the first machining surface 3001) (first)→moving to the second machining position 2904 (a second machining surface 3002), one hour machining (first)→again, moving to the first machining position 2901 (the first machining surface 3001), one hour machining (second)→moving to the second machining position 2904 (the second machining surface 3002), one hour machining (second)→again, moving to the first machining position 2901 (the first machining surface 3001), one hour machining (third)→moving to the second machining position 2904 (the second machining surface 3002), and one hour machining (third). Then, the machining process is ended (the case of FIG. 30(*b*)). Further, the same process is also applied to the cases of FIGS. 30(*c*) and 30(*d*). In the case of the above machining method, the first machining hour is short, and thus the redeposition amount of the machining surface is significantly reduced. In addition, the redeposition generated in the machining surface is removed in the next machining, so that a good cross section is obtained. In the setting of the machining method, the machining time period of one place is divided into several periods, or dividing hours may be input.

In addition, a machining method illustrated in FIG. 30(*e*) may be employed. In other words, for example, about 95% machining is completed at the first machining position 2901 (the first machining surface 3001) (first), the process moves to the second machining position 2904 (the second machining surface 3002) to complete the machining at the second machining position 2904 (the second machining surface 3002) by one machining (for example, 3 hours of machining). Then, the process moves to the first machining position 2901 (the first machining surface 3001) again, and the machining at the first machining position 2901 (the first machining surface 3001) is completed. With this configuration, the machining hour in the first machining position 2901 (the first machining surface 3001) can be set to be significantly short. Therefore, it is possible to significantly prevent the redeposition 3003 from being generated in the second machining position 2904 (the second machining surface 3002).

Further, a machining method as illustrated in FIG. 30(*f*) may be employed. In other words, the machining at the first machining position 2901 (the first machining surface 3001) is completed by one time (for example, 3 hours of machining), the process moves to the second machining position 2904 (the second machining surface 3002), and is completed by one time of machining (for example, 3 hours of machining). Then, the process moves to the first machining position 2901 (the first machining surface 3001) again, and a finishing process is performed at the first machining position 2901 (the first machining surface 3001) by an acceleration voltage which is weaker than that at the time of machining. Further, the process moves to the second machining position 2904 (the second machining surface 3002) again, and the finishing process is performed similarly. With such a finishing process performed last, the redeposition can be removed even the redeposition is generated at a machining position, and a desired machining can be realized.

Further, when the multipoint milling is performed as described above (in the case of FIGS. 30(*b*) to 30(*f*)), the respective machining positions are set, and the number of times of machining and the machining hours at each machining place are set.

To sum up the multipoint milling described above, a plurality of machining positions and the number of milling operations in each of the plurality of machining positions are set, and the sample is machined at each machining position according to the information on each machining position and the number of milling operations at each machining position. At that time, at least one milling operation is performed alternately in at least one of the plurality of machining positions. In other words, for example, one time of milling operation is necessarily performed at each machining position in an alternate manner as illustrated in FIGS. 30(*b*) to 30(*f*). In addition, a plurality of times of milling operations are performed in at least one of the plurality of machining positions with a time interval therebetween. In other words, for example, in FIG. 30(*b*), after a first milling operation is performed at a first machining surface 3001, the first milling operation is performed at a second machining position 3002 before a second milling operation is performed. In addition, the final machining is performed sequentially at the respective machining positions (see FIGS. 30(b) to 30(d), and 30(f)).

In the ion milling device of the related art, when the machining is completed at one place, there is a need to evacuate the vacuum chamber to the air once, change the machining position, and make the vacuum chamber be the vacuum state again. With this regard, in the ion milling device according to the embodiment, the machining is automatically performed on a plurality of places (for example, 3 places), so that the machining can be performed on the plurality of places at one time. Therefore, it is possible to easily obtain an optimal machining condition of the machining sample. More specifically, the multipoint milling can set the respective machining conditions (discharge voltage, acceleration voltage, current amount, reciprocating slope angle, cooling temperature, etc.) at the respective machining positions. Therefore, it becomes easy to approach an optimal condition. For example, a sample is machined under a condition that the acceleration voltage at the first place is set to 2 kV, the acceleration voltage at the second place is set to 4 kV, and the acceleration voltage at the third place is set to 6 kV.

In addition, it is possible to employ many applications by setting the wide region milling at the respective machining positions of the multipoint milling.

<Applications of Wide Region Milling>

FIG. 31 is a diagram illustrating an application of the wide region milling. Herein, the description will be given about a case where a machining place is not set clearly. This machining method is effective in a case where the machining is performed in a short time.

According to the related art, as illustrated in FIG. 31(a), in a case where the position of a machining object (for example, defect) is unclear, a machining surface 3102 is necessarily machined by an ion beam 3101 at an approximate position. However, there is a possibility to take too much time in such a method.

Therefore, a machining object is found and machined with efficiency by using the wide region milling. Specifically, as illustrated in FIG. 31(b), the wide region milling is performed (emitting a beam while reciprocating, tilting, and driving the sample 3 to slide). When a machining object (position) 3103 is found (an optical microscope for machining observation (installed in the upper portion of the machining observation window 7), or naked eye), the machining is stopped. Next, as illustrated in FIG. 31(c), the sample holder is moved (slid) to match the ion beam axis to the machining position, and a normal milling is performed.

The method in which the wide region milling applied to find a machining position and a normal milling having a high milling rate are combined can significantly shorten the machining hours compared to a case where the wide region milling is performed to the end.

<Application of Multipoint Milling>

FIGS. 32 to 34 are diagrams for describing an application of the multipoint milling. FIG. 32 is a diagram for describing a method of fixing a plurality of samples having different thicknesses. FIG. 33 is a diagram illustrating a state where the plurality of samples having different thicknesses are arranged and fixed to a mask. FIG. 34 is a diagram illustrating a state where the samples having different thicknesses are machined and moved to an observation device for observation.

Herein, the description will be given about a method of performing one time of the cross-sectional milling on a plurality of samples as an application of the multipoint milling. In a normal cross-sectional milling, the sample holder 23 bonded with the sample 3 is installed in the sample mask unit 21. In the sample fixing method, in a case where the sample having a different thickness is bonded to the sample holder 23, a gap occurs between the sample (thin one) and the mask 2 when the sample having a different thickness is disposed, and thus a smooth cross section is not obtained.

Therefore, the sample is fixed using a projection adjusting tool 90 as illustrated in FIGS. 32(a) to 32(c). First, the upper surface (near a portion where the ion beam emits) of the mask 2 comes into contact with a base 91 of the projection adjusting tool 90, and the mask 2 is fixed by a fixing screw 92. When the mask 2 is fixed, a contact surface between the mask 2 and a position adjusting base 93 is made in parallel using the right wall of the base 91. A gap 3201 between the mask 2 and the position adjusting base 93 (moving along the linear guide) is adjusted using a micrometer 94. When the gap 3201 is large, the micrometer 94 is turned in a counterclockwise direction and pressed by a pressure of a spring 95. After fixing the mask 2 to the base 91, the micrometer 94 is turned to bring the position adjusting base 93 into contact with the mask 2. A value (initial value) of the micrometer at that time is stored.

Next, the micrometer 94 is turned in a counterclockwise direction to adjust the gap 3201 between the mask 2 and the position adjusting base 93. A distance (which is equal to a projection amount to be described below) of the gap 3201 becomes a value from which the current value and the initial value of the micrometer 94 are subtracted. Therefore, the distance may be adjusted to any value. After setting the distance of the gap 3201, the fixing position is determined while bringing the sample 3 into contact with the position adjusting base as illustrated in FIG. 32(c), and the sample 3 is brought into direct contact with the mask 2 (the surface of the sample 3 where the ion beam is emitted is brought into contact with the mask 2). When the sample is bonded as described above, the distance of the gap 3201 becomes equal to a projection amount 3301. Further, since the sample 3 can be directly fixed to the mask, it is possible to arrange and fix the plurality of samples having different thicknesses. While not illustrated in the drawings, the projection amount 3301 of the sample 3 may be different from each other (see FIG. 33).

After fixing (bonding) all the samples to the mask 2, the fixing screw is released to take the mask 2 to which the sample is fixed out of the projection adjusting tool. The mask 2 is fixed to the mask holder 25 (the sample mask unit 21) using the mask fixing screw 27. With the fixing method and the multipoint milling (description of the above-described adjustment of X and Y (X3 and Y3 of FIG. 8 (herein, X3 corresponds to a motor driving) of the sample mask unit micromotion mechanism 4 will be omitted)), the plurality of samples can be machined by one time of the milling process.

After the plurality of samples fixed to the mask 2 is machined, the mask 2 is taken out of the ion milling device, and attached to a sample disposing base 105 of an observation device (SEM) (see FIG. 34). The sample disposing base 105 is configured to fix the mask 2 to a fixing screw 106, and the mask 2 fixed to the sample 3 can be easily fixed to the sample disposing base 105.

In addition, a female screw (in a case where a male screw 3402 is provided near a sample fixing base 107 of the observation device) 3401 is provided in the bottom surface of the sample disposing base 105, and may be fixed to the male screw 3402 of the sample fixing base 107 of the observation device. Therefore, the mask 2 fixed with the sample 3 is easily disposed in the observation device, and can be observed. The position of the female screw 3401 of the sample disposing base 105 is desirably set such that the machining surface is disposed on the center axis of the male screw 3402 so as to easily find the machining surface at the time of observation.

<Modifications>

(i) In the ion milling device illustrated in FIGS. 1 and 10, the sample mask unit micromotion mechanism 4 on which the sample mask unit 21 is mounted is detachably connected to the sample unit base 5.

However, even in a case where the sample unit base 5 and the sample mask unit micromotion mechanism 4 to which the sample mask unit 21 is mounted are formed integrally, the same machining is possible by mounting the optical microscope 40 in the device. Further, in this case, the motor cable (out) 74, the motor cable (in) 75, and the slide milling holder 70 are not possible to be taken in and out, but a space for adjusting the positions may be limited.

(ii) In the embodiment, the description has been given on an assumption that the ion milling device and the observation device (SEM) are configured separately. However, these devices may be integrally configured. In this case, for example, there is provided a mechanism which shares the sample unit base 5 and the sample mask unit 21, and switches the ion source used at the time of the ion milling and an electronic gun used at the time of observing the machining surface. Since the information on a machining place of the ion milling (position information) is stored in the control unit 103, the information may be used even in the observation device, and there are advantages that the controls such as positioning at the time of observation are easily performed. In addition, the sample after machining is taken out of the ion milling device. Further, a labor for installing the observation device may be saved, so that the throughput from the machining to the observation may be improved.

CONCLUSIONS (i) In the wide region milling, the reciprocating slope operation and the slide operation are performed at the same time during emitting the ion beam, so that a wide machining width is obtained regardless of the diameter of the ion beam. Therefore, it is effective to a sample which is necessary for a wide range of observation and analysis. In addition, after finishing the cross-sectional milling (the reciprocating slope operation during emitting the ion beam), the multipoint milling is performed to slide the sample to a predetermined machining position (or positions), and the cross-sectional milling may be further performed on the position. Therefore, the machining is automatically performed at a plurality of positions, and it is possible to improve the throughput.

The ion milling device according to the embodiment includes a sample sliding mechanism which slides the sample holder in a direction including a normal direction of the axis of the ion beam. In addition, the ion milling device may include a rotation mechanism which rotates and tilts the sample holder by turning an axis perpendicular to the sliding direction of the sample sliding mechanism. In this case, the slide movement mechanism (motor drive) is desirably disposed in the upper portion of the rotation mechanism (a mechanism of which the reciprocating slope (rotation) axis does not move even in a case where the slide operation is performed), and a position of the rotation shaft of the rotation mechanism does not desirably moved. In addition, the rotation shaft of the rotation mechanism is preferably positioned on a path of the ion beam. Further, the slide movement mechanism desirably slides the sample in a surface perpendicular to the rotation shaft of the rotation mechanism. With this configuration, while emitting the ion beam, the sample is subjected to the reciprocating slope operation (a normal cross-sectional milling), and also the reciprocating slide operation (a slide operation wider than the ion beam width) is performed. With this machining method, a desired machining width is obtained by one time of processing (wide region milling). The machining width of the wide region milling is not limited to the ion beam width, so that it is possible to obtain a wide range of the machining surface (observation surface).

In addition, after completing the cross-sectional milling using the slide movement mechanism, the machining is automatically moved (slid) to the next machining position, and the cross-sectional milling is performed at the moved position again. With this machining method, it is possible to automatically perform the cross-sectional milling on a plurality of places (multipoint milling). Since the cross-sectional milling of the plurality of places can be performed by one time of processing, the multipoint milling can improve the throughput.

(ii) The ion milling device according to the embodiment includes the ion source which emits the ion beam, the sample holder which holds the sample, the sample sliding mechanism which slides the sample holder in a direction including a normal direction of the axis of the ion beam, and a control unit. The control unit controls the sample sliding mechanism based on machining information which is input regarding a machining content of the sample, and allows the wide region milling which is performed on the sample over a range wider than the width of the ion beam, and/or the multipoint milling which is performed on a plurality of places of the sample to be performed. With this configuration, it is possible to automatically perform the wide region milling and the multipoint milling by one ion milling device. In addition, it is also possible to combine the wide region milling and the multipoint milling.

(iii) The ion milling device according to the embodiment includes a user interface unit which is possible to select at least one of the wide region milling which is performed on the sample over a region wider than the width of the ion beam and the multipoint milling which is performed on a plurality of places of the sample, and the control unit which controls the milling operation with respect to the sample based on a selection input with respect to the user interface unit. With this configuration, the user is able to perform a desired milling operation with efficiency by selecting one of the wide region milling and the multipoint milling, or by combining two milling operations.

Further, in a case where the wide region milling and the multipoint milling both are selected, the control unit controls the milling operation while switching the operation between the wide region milling and the multipoint milling. With this configuration, it is possible to perform the wide region milling and the multipoint milling with efficiency by one time of processing.

(iv) In the embodiment, when the ion milling is performed, first, the sample is disposed on the optical microscope. Then, the optical microscope is used to set the machining position and the machining width of the wide region milling which is performed on the sample over a region wider than the width of the ion beam, and the plurality of the machining positions of the multipoint milling which is performed on the plurality of places of the sample with respect to the sample. Next, the information on the machining position and the machining width of the wide region milling, and the information on the plurality of machining positions of the multipoint milling are transmitted to the control unit which controls the milling operation. Then, the sample is taken out of the optical microscope, and disposed in the ion milling device. The control unit controls the milling operation in the ion milling device based on the information on the machining position and the machining width of the wide region milling and the information on the plurality of machining positions of the multipoint milling. With the above operations, the wide region milling and the multipoint milling are performed. With this configuration, it is possible to automatically perform the wide region milling and the multipoint milling with efficiency by one time of processing. Further, the same procedure is performed even in a case where only one of the wide region milling and the multipoint milling is performed.

(v) The multipoint milling may be performed along the following procedure. First, the plurality of machining positions when the multipoint milling is performed and the number of milling operations at the plurality of machining positions are set. Next, the plurality of machining positions of the sample are machined according to the information on the plurality of machining positions and the number of milling operations. At that time, at least one milling operation in at least a part of the plurality of machining positions is performed alternately, and a plurality of times of milling operations are performed on at least one of the plurality of machining positions with a time interval therebetween. In a case where the milling operation is performed with a time interval, the milling operation at the other machining position is performed during the time interval. With this configuration, it is possible to significantly reduce the redeposition which is likely to be generated in the respective machining positions.

In addition, the final stage of machining (the final milling operation) may be sequentially performed on the plurality of machining positions. In this way, the final machining is sequentially performed at the respective machining positions, so that it is possible to significantly suppress the redeposition which is likely to be generated at the respective machining positions.

Further, the finishing machining may be performed at an acceleration voltage weaker than that used when the machining is performed alternately at the plurality of machining positions. Even in this case, the same effect of suppressing the redeposition can be achieved.

(vi) According to the embodiment, it is possible to perform the following milling. First, the wide region milling is performed on the sample over a region wider than the width of the ion beam, and the machined places are searched. Then, the machined place where the deposition is found is subjected to the wide region milling in a depth direction of the sample. With this configuration, the hardly found places can be found by the wide region milling with efficiency, and then the places can be subjected to an intense milling. Therefore, it is possible to improve the throughput.

(vii) According to the embodiment, the milling may be performed along the following procedure. First, the plurality of samples are attached to the sample mask such that the sample protrudes from the mask by a predetermined amount. Next, the machining position is set with respect to each of the plurality of samples. Then, the ion beam is emitted to the sample from the sample mask, the multipoint milling is performed to machine a plurality of places of the sample, and the plurality of samples are machined. In this case, the plurality of samples may include samples having different thicknesses. With this configuration, the samples having different thicknesses can be subjected to the milling by one time of processing. In addition, it is possible to avoid a risk such as a gap generated between the sample and the mask due to the different thickness of the sample, and the redeposition generated due to the ion beam going around the gap.

REFERENCE SIGNS LIST

1: ion source
2: mask
3: sample
4: sample mask unit micromotion mechanism
5: sample unit base
6: evacuation system
7: machining observation window
8: sample stage
9: rotating member
10: flange
11, 24: linear guide
12: loupe
13: loupe micromotion mechanism
15: vacuum chamber
21: sample mask unit
22: sample holder rotation ring
23: sample holder
25: mask holder
26: mask fine adjustment mechanism
27: mask fixing screw
28: sample holder rotation screw
29: reverse rotating spring
30: sample holder position control mechanism
35: sample holder metal fitting
40: optical microscope
41: observation stand
42: fixing base
50: gear
51: bearing
52: mask unit fixing unit
53: shaft coupling
54: linear device
55: motor
60: sample stage drawing mechanism
70: slide milling holder
71: X gear
72: motor unit
73: M gear
74: motor cable (out)
75: motor cable (in)
76: L button
77: R button
78: SET button
80: control BOX
81: operation unit
90: projection adjusting tool
91: base
92: fixing screw
93: position adjusting base
94: micro meter
95: spring
100: ion milling device
101: shutter
102: optical microscope driver
103: control unit
104: vacuum chamber driver
105: sample disposing base
106: fixing screw 107: sample fixing base
2101: machining region
2401: ion beam
2402: machining surface
2403: slide range
2501: ion beam probe
2502: rotation tilting shaft
2503: reciprocating slope operation
2601: slide direction
2602: interference place
2701: slide direction
2901: first machining position
2902: machining surface
2903: slide driving direction
2904: second machining position
3001: first machining surface 3001
3002: second machining position
3003: redeposition
3101: ion beam
3102: machining surface
3103: machining object
3201: gap
3301: projection amount
3401: female screw
3402: male screw
3501: motor unit
3502: motor unit

The invention claimed is:

1. An ion milling device which emits an ion beam to a sample to machine the sample, comprising:
   an ion source which emits the ion beam;
   a sample holder which holds the sample of which at least a part is shielded by a mask;
   a sliding mechanism which slides the sample holder in a direction including a normal direction of an axis of the ion beam;
   a rotation mechanism which rotates and tilts the sample holder around an axis perpendicular to a direction of a sliding movement caused by the sliding mechanism; and
   a control unit which controls the sliding mechanism, wherein
      while emitting the ion beam, the sample is subjected to the slide reciprocating drive by the sliding mechanism, and a desired machining width is obtained by one time of processing, such that the sample undergoes movement in two opposite directions, and a width equal to the desired machining width is exposed to the ion beam.

2. The ion milling device according to claim 1, wherein the sliding mechanism slides the sample with a width wider than a width of the ion beam.

3. The ion milling device according to claim 1, wherein the sliding mechanism is installed above the rotation mechanism, and a position of a rotation shaft of the rotation mechanism is constant.

4. The ion milling device according to claim 3, wherein the rotation shaft of the rotation mechanism is on a path of the ion beam.

5. The ion milling device according to claim 4, wherein the slide movement mechanism slides the sample in a plane perpendicular to the rotation shaft of the rotation mechanism.

6. The ion milling device according to claim 1, further comprising:
   a user interface which sets machining information which is input based on a machining content of the sample, wherein
      the control unit controls the sliding mechanism based on the machining information set by the user interface.

* * * * *